(12) United States Patent
Matsuoka

(10) Patent No.: US 8,476,931 B2
(45) Date of Patent: Jul. 2, 2013

(54) SEMICONDUCTOR DEVICE

(75) Inventor: Fumiyoshi Matsuoka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/306,760

(22) Filed: Nov. 29, 2011

(65) Prior Publication Data
US 2012/0133393 A1 May 31, 2012

(30) Foreign Application Priority Data
Nov. 30, 2010 (JP) .................................. 2010-267034

(51) Int. Cl.
*H03K 19/0175* (2006.01)
(52) U.S. Cl.
USPC ................... 326/86; 326/83; 326/87; 326/30; 326/21; 327/108
(58) Field of Classification Search
USPC .................. 326/21–30, 83, 86; 327/108–112, 327/170
See application file for complete search history.

(56) References Cited

U.S. PATENT DOCUMENTS

| 6,768,363 | B2 * | 7/2004 | Yoo et al. ...................... 327/170 |
| 7,205,786 | B2 * | 4/2007 | Ahmad ........................... 326/30 |
| 7,663,440 | B2 | 2/2010 | Komori et al. |
| 2003/0189446 | A1 * | 10/2003 | Yoo et al. ...................... 327/108 |
| 2005/0001653 | A1 * | 1/2005 | Ahmad ........................... 326/87 |
| 2008/0136524 | A1 | 6/2008 | Komori et al. |
| 2011/0133792 | A1 | 6/2011 | Koyanagl et al. |

FOREIGN PATENT DOCUMENTS
JP         2008 147735 A2    6/2008

* cited by examiner

*Primary Examiner* — Vibol Tan
(74) *Attorney, Agent, or Firm* — Knobbe Martens Olson & Bear LLP

(57) ABSTRACT

A semiconductor device includes a core circuit including an integrated circuit; output drivers, each including sub-drivers to output digital data transferred from the core circuit, as output data; and a selector that selects a sub-driver to be driven from among the plurality of sub-drivers. Each of the sub-drivers includes: an output transistor connected between a first power supply and an output wiring line to allow the output data to rise or fall according to the digital data; and a switching transistor and a slew-rate control transistor which are connected in series between a gate of the output transistor and a second power supply. The switching transistor turns on or off the output transistor according to the digital data. A gate potential adjusted to determine a slew rate for rise or fall of the output data is selectively provided by the selector to each slew-rate control transistor.

19 Claims, 24 Drawing Sheets

SEMICONDUCTOR DEVICE

CROSS REFERENCE TO RELATED APPLICATIONS

This application is based upon and claims the benefit of priority from the prior Japanese Patent Application No. 2010-267034, filed on Nov. 30, 2010, the entire contents of which are incorporated herein by reference.

FIELD

The embodiments of the present invention relate to a semiconductor device.

BACKGROUND

A semiconductor device such as a semiconductor memory includes an output driver that outputs digital data outside a chip. The output driver outputs data DQ as well as a strobe signal DQS which is a reference clock. At this time, when the drive capabilities (current drive capabilities) to pull up and down an output signal differ from each other, the timings at which the strobe signal DQS and the data DQ rise or fall are shifted from each other. By this, the data valid window decreases. Such a decrease in data valid window becomes a significant problem particularly in a semiconductor device that performs high-speed operation, such as a DRAM adopting DDR (Double Data Rate) Interface. To suppress a decrease in output data valid window, it is important for the output driver to make the drive capabilities to pull up and down an output signal equal to each other.

In addition, the slope (slew rate) of rise or fall of an output data waveform also affects the data valid window. For example, when the slew rate is low, the slope of rise or fall of output data is moderate and thus the output data valid window decreases. When the slew rate is high, the slope of rise or fall of output data is steep and thus the output data valid window does not decrease almost at all. Meanwhile, a sudden rise or fall of output data means sudden charge or discharge of a data bus and thus it may cause power supply noise, ringing, due to SSO (Simultaneous Switching Output) or reflection of an output signal, resulting in signal integrity degradation. Therefore, it is desirable that the output driver have a function to control slew rates in order to maintain a certain output data valid window suppressing power supply noise or reflection of an output signal.

Conventionally, to compose an output driver capable of adjusting the drive capability and the slew rate, a transistor Tr1 that receives a signal for enabling a sub-driver selectively, a transistor Tr2 that receives a signal for output data, and a transistor Tr3 that receives a signal for controlling the slew rate need to be connected in series. In order for the transistor Tr3 to dominantly control the slew rate, the current drive capabilities of other transistors Tr1 and Tr2 need to be sufficiently high with respect to the current drive capability of the transistor Tr3. Hence, the sizes of the transistors Tr1 and Tr2 need to be equal to or larger than the size of the transistor Tr3. In recent years, a reduction in power supply voltage of I/O circuits has been advanced and thus the current drive capabilities of transistors have inevitably decreased. Therefore, to maintain the current drive capabilities of transistors as high as possible, it is required to further increase the sizes of the transistors Tr1 to Tr3. However, if the sizes of the transistors Tr1 to Tr3 increase, then it becomes difficult to achieve a fine-line semiconductor device.

DETAILED DESCRIPTION

A semiconductor device according to the present embodiment includes: a core circuit composed of an integrated circuit; a plurality of output drivers, each including a plurality of sub-drivers to output digital data transferred from the core circuit, as output data; and a selector that selects one or more sub-drivers to be driven from among the plurality of sub-drivers. Each of the sub-drivers includes: an output transistor connected between a first power supply and an output wiring line to allow the output data to rise or fall according to the digital data; and a switching transistor and a slew-rate control transistor which are connected in series between a gate of the output transistor and a second power supply. The switching transistor turns on or off the output transistor according to the digital data. A gate potential adjusted to determine a slew rate for rise or fall of the output data is selectively provided by the selector to each slew-rate control transistor.

Embodiments will now be explained with reference to the accompanying drawings.

First Embodiment

Figure 1:
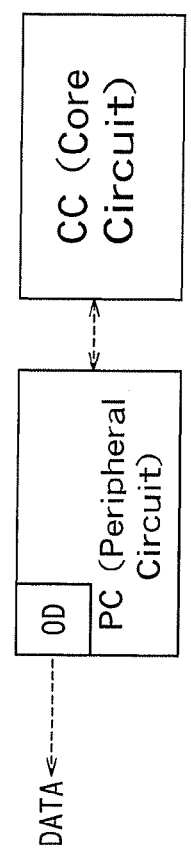
FIG. 1 is a block diagram showing a configuration of a semiconductor device according to a first embodiment.

FIG. 1 is a block diagram showing a configuration of a semiconductor device according to a first embodiment. The semiconductor device according to the present embodiment includes a core circuit CC and a peripheral circuit PC. The core circuit CC includes, though not particularly limited, for example, memory cells and circuits that drive the memory cells (e.g., a row decoder, a column decoder, a sense amplifier, etc.).

The peripheral circuit PC is configured to control the core circuit CC in response to an external instruction or store externally inputted data in the core circuit CC. The peripheral circuit PC is further configured to externally output data from the core circuit CC.

The peripheral circuit PC includes output drivers ODs that amplify output data and output the amplified output data outside the semiconductor device.

Figure 2:
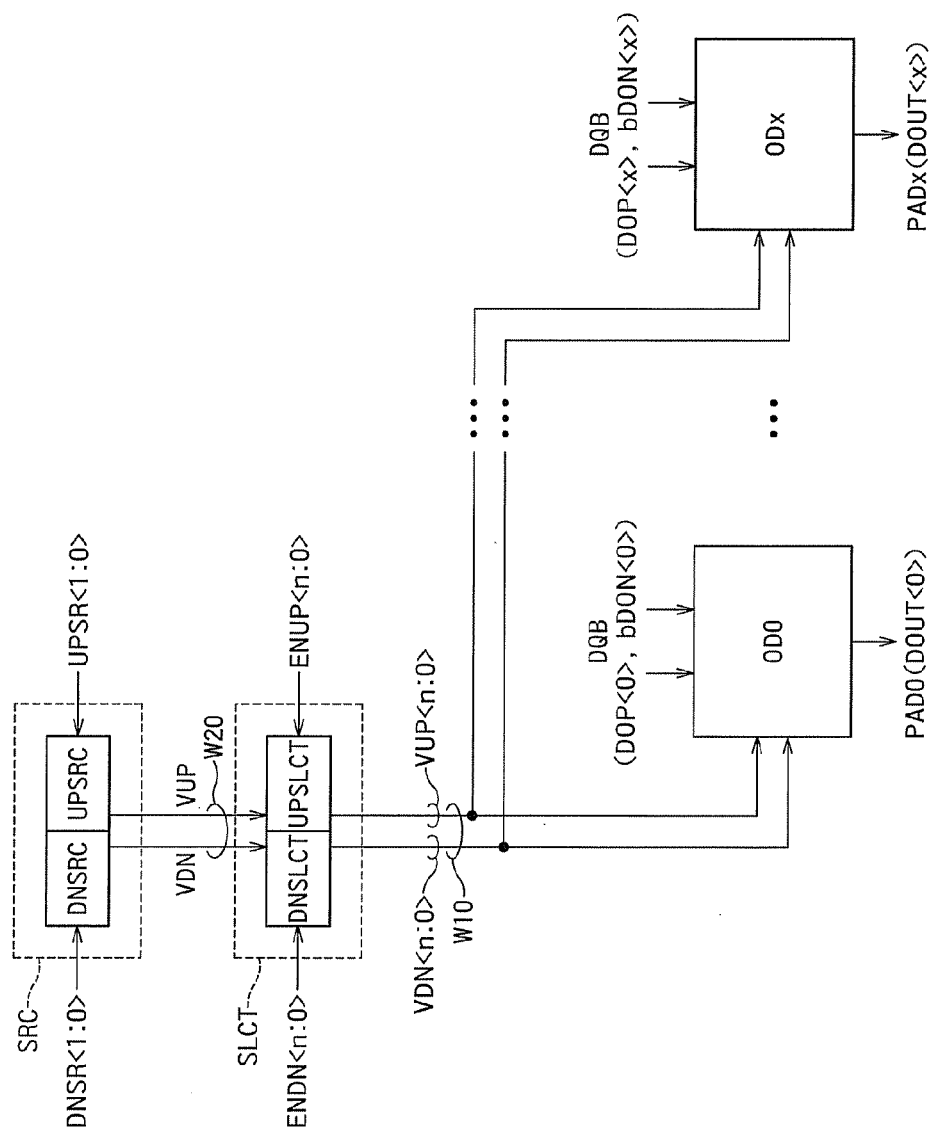
FIG. 2 is a block diagram showing a relationship between the output drivers ODs, a selector SLCT, and a slew rate controller SRC in the semiconductor device according to the first embodiment.

FIG. 2 is a block diagram showing a relationship between the output drivers ODs, a selector SLCT, and a slew rate controller SRC in the semiconductor device according to the first embodiment. In the present embodiment, the selector SLCT and the slew rate controller SRC are shared by the plurality of output drivers ODs. The selector SLCT includes a pull-up selector UPSLCT and a pull-down selector DNSLCT. The slew rate controller SRC includes a pull-up slew rate control circuit UPSRC and a pull-down slew rate control circuit DNSRC.

The output drivers ODs (OD0 to ODx) are provided for respective output pads PADs (PAD0 to PADx). Each output driver OD includes a plurality of pull-up sub-drivers UPSD<0>, UPSD<1>, ... UPSD<n> (hereinafter, also collectively referred to as UPSD<n:0> or simply referred to as UPSDs); and a plurality of pull-down sub-drivers DNSD<0>, DNSD<1>, ... DNSD<n> (hereinafter, also collectively referred to as DNSD<n:0> or simply referred to as DNSDs) (see FIG. 3).

The slew rate controller SRC outputs slew rate control signals VUP and VDN which are decided by slew-rate control bits UPSR<1:0> and DNSR<1:0>.

The selector SLCT selectively applies the slew-rate control signals VUP and VDN to the pull-up sub-drivers UPSD<n:0> and the pull-down sub-drivers DNSD<n:0>, based on enable signals ENUP<n:0> and ENDN<n:0>. To a selected pull-up sub-driver UPSD<i> and a selected pull-down sub-driver DNSD<i> (i is an integer between 0 and n, inclusive), potentials having levels equal to the slew-rate control signals VUP and VDN are provided as signals VUP<i> and VDN<i>. To an unselected pull-up sub-driver UPSD<i> and an unselected pull-down sub-driver DNSD<i>, potentials having a level at which the sub-drivers are deactivated are provided as signals VUP<i> and VDN<i>. Note that <n:0> has the same meaning as n to 0, and n is an integer.

Signals DOP<k> and bDON<k> (k is an integer between 0 and x, inclusive) are generated from digital data transferred from the core circuit CC through a DQ buffer DQB. A selected pull-up sub-driver UPSD allows output data DOUT<k> to rise at a slew rate which is determined by the slew-rate control signal VUP, when the signal DOP<k> rises from "L" to "H". A selected pull-down sub-driver DNSD allows the output data DOUT<k> to fall at a slew rate (slope) which is determined by the slew-rate control signal VDN, when the signal bDON<k> falls from "H" to "L".

Here, the signal DOP<k> is a signal for driving a pull-up driver at logic high. The signal bDON<k> is a signal for driving a pull-down driver at logic low. When logic-high data is outputted, the signal DOP is logic high and the signal bDON is also logic high and thus only the pull-up driver is driven. When logic-low data is outputted, the signal DOP is logic low and the signal bDON is also logic low and thus only the pull-down driver is driven. When data is not outputted, the signal DOP is logic low and the signal bDON is logic high and thus neither the pull-up driver nor the pull-down driver is driven.

In addition, to the unselected pull-up sub-driver UPSD and pull-down sub-driver DNSD, signals VUP<i> and VDN<i> that deactivate the drivers are provided, respectively, and thus the drivers are not driven.

As such, each output driver OD can allow output data DOUT to rise or fall at an appropriate slew rate by selectively driving a plurality of pull-up sub-drivers UPSDs and a plurality of pull-down sub-drivers DNSDs.

In the present embodiment, slew-rate control signals VUP<n:0> are common to the plurality of output drivers OD0 to ODx (x is an integer). Slew-rate control signals VDN<n:0> are also common to the plurality of output drivers ODs. Therefore, since pull-up sub-drivers UPSDs and pull-down sub-drivers DNSDs which are selected in the respective output drivers OD0 to ODx are identical, the output drivers OD0 to ODx can allow their respective output data DOUT to rise or fall at substantially equal slew rates.

Figure 3:
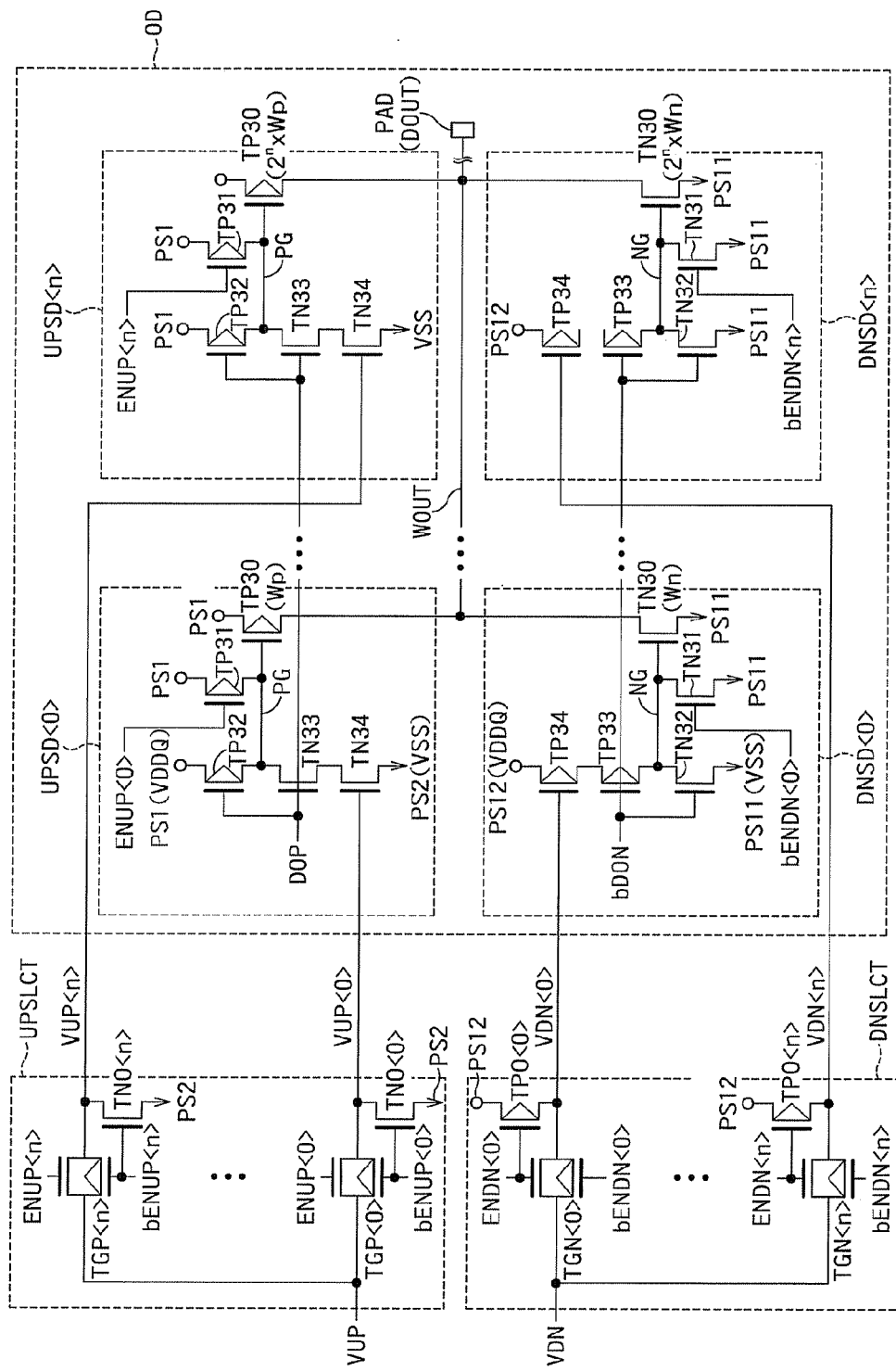
FIG. 3 is a circuit diagram showing more detailed configurations of an output driver OD, the pull-up selector UPSLCT, and the pull-down selector DNSLCT according to the first embodiment.

FIG. 3 is a circuit diagram showing more detailed configurations of an output driver OD, the pull-up selector UPSLCT, and the pull-down selector DNSLCT according to the first embodiment. As described above, the output drivers ODs are provided for the respective pads that output data, and are driven when data is outputted from their corresponding pads. Each output driver OD includes a plurality of pull-up sub-drivers UPSD<0> to UPSD<n> and a plurality of pull-down sub-drivers DNSD<0> to DNSD<n> (n is an integer) that determine an output voltage in order to output digital data transferred from the core circuit CC, with the output voltage.

The pull-up sub-drivers UPSD<0> to UPSD<n> are selected by enable signals ENUP<0> to ENUP<n>, respectively. A single or a plurality of selected pull-up sub-drivers is driven to allow output data to rise (to pull up output data). The pull-down sub-drivers DNSD<0> to DNSD<n> are selected by enable signals ENDN<0> to ENDN<n>, respectively. A single or a plurality of selected pull-down sub-drivers is driven to allow the output data to fall (to pull down the output data).

The output driver OD converts digital data from the core circuit CC to an output voltage level and outputs the digital data from the output pad PAD as output data DOUT. At this time, the pull-up sub-drivers (logic-high output sub-drivers) UPSD<0> to UPSD<n> are used to pull up the output data DOUT when logic low is brought up to logic high. The pull-down sub-drivers (logic-low output sub-drivers) DNSD<0> to DNSD<n> are used to pull down the output data DOUT when logic high is brought down to logic low.

[Configurations of the Pull-Up Sub-Drivers UPSD<0> to UPSD<n> and the Pull-Up Selector UPSLCT]

Each of the pull-up sub-drivers UPSD<0> to UPSD<n> includes P-type transistors TP30 to TP32 and N-type transistors TN33 and TN34. The transistor TP30 serving as an output transistor is connected between a first power supply PS1 of the pull-up sub-driver and an output wiring line WOUT. The power supply PS1 is a power supply that supplies a high-level voltage VDDQ. The output wiring line WOUT is connected to an output pad PAD. Output data is outputted outside a semiconductor device chip through the output wiring line WOUT and the output pad PAD.

The transistor TP30 operates to connect the high-level power supply PS1 to the output wiring line WOUT in order to output logic high. The size of the transistor TP30 varies among the pull-up sub-drivers UPSD<0> to UPSD<n>. The sizes of the transistors TP30 in the pull-up sub-drivers UPSD<0> to UPSD<n> are made different in a binary fashion, such as Wp, 2×Wp, $2^2$×Wp . . . $2^n$×Wp. Namely, the transistor TP30 in a pull-up sub-driver UPSD<i> (i=0 to n) has a size of $2^i$×Wp. By this, the output driver OD can adjust the drive capability to pull up the output data DOUT, by a combination of pull-up sub-drivers selected from among UPSD<0> to UPSD<n> (hereinafter, also simply referred to as UPSDs).

A gate node PG of the transistor TP30 is connected to the power supply PS1 through the P-type transistor TP31 and is connected to the power supply PS1 through the P-type transistor TP32. That is, the transistors TP31 and TP32 are connected in parallel between the power supply PS1 and the gate node PG. The gate of the transistor TP31 receives an enable signal ENUP<i>. The gate of the transistor TP32 receives a signal DOP in common with the gate of the transistor TN33.

When the signals DOP and bDON are logic high, the pull-up sub-driver UPSD needs to allow the output data DOUT to rise.

However, even if the signal DOP is logic high, when the pull-up sub-driver UPSD<i> is unselected (when the enable signal ENUP<i> is logic low (an inactive state)), the unselected pull-up sub-driver UPSD<i> does not operate. Therefore, the transistor TP31 in the unselected pull-up sub-driver UPSD<i> provides a power supply voltage VDDQ to the gate node PG so as to securely place the corresponding transistor TP30 in an off state. Namely, the transistor TP31 is a transistor for an unselected pull-up sub-driver that functions to place the transistor TP30 in the unselected pull-up sub-driver UPSD<i> in an off state, based on the enable signal ENUP<i>.

When the signals DOP and bDON are logic low (when a pull-down sub-driver DNSD<i> allows the output data DOUT to fall), all of the pull-up sub-drivers UPSD<0> to UPSD<n> need to be placed in an inactive state. Therefore, the transistors TP32 in all of the pull-up sub-drivers UPSD<0> to UPSD<n> provide a power supply voltage VDDQ to their gate nodes PGs so as to securely place their transistors TP30 in an off state. Namely, each transistor TP32 functions as a switching transistor which is interposed between the gate node PG of the transistor TP30 and the power supply PS1 to place the transistor TP30 in an off state based on the signal DOP.

Meanwhile, the gate node PG of the transistor TP30 is connected to a second power supply PS2 (VSS) of the pull-up sub-driver through the N-type transistors TN33 and TN34. That is, the transistors TN33 and TN34 are connected in series between the gate node PG and the power supply PS2. The second power supply PS2 of the pull-up sub-driver is a power supply that supplies a low-level voltage VSS which supplies a lower voltage than that supplied by the first power supply PS1 of the pull-up sub-driver. When the signal DOP is logic high, the transistor TN33 provides a power supply voltage VSS to the gate node PG so as to securely place the transistor TP30 in an on state. Namely, the transistor TN33 functions as a switching transistor which is interposed between the gate node PG of the transistor TP30 and the power supply PS2 to place the transistor TP30 in an on state based on the signal DOP. As such, the transistors TN33 and TP32 are switching transistors that complementarily operate to perform on/off control of the output transistor TP30 according to the signal DOP.

The transistor TN34 serving as a slew-rate control transistor is connected between the transistor TN33 and the low-level voltage supply PS2 and is controlled by the pull-up selector UPSLCT. At this time, the pull-up selector UPSLCT drives only a transistor(s) TN34 in a single or a plurality of pull-up sub-drivers UPSDs which are selected by an enable signal(s) ENUP<i>, so as to place the transistor(s) TN34 in a conducting state and maintains transistors TN34 in all other unselected pull-up sub-drivers in a non-conducting state. A voltage VUP applied to the gate of the transistor TN34 in the selected pull-up sub-driver UPSD controls the conducting state (on resistance) of the transistor TN34 and controls the rate of voltage drop at the gate node PG. By this, the speed at which the transistor TP30 enters an on state is controlled and thus a slew rate (slope) for the rise of the output voltage DOUT is determined. As such, the transistor TN34 has both the function of being a selection transistor which is placed in a conducting state only when selected by the enable signal ENUP<i> and the function of controlling the slew rate for the rise of the output voltage DOUT.

The pull-up selector UPSLCT has transfer gates TGP<0> to TGP<n>, the number of which is equal to that of the pull-up sub-drivers UPSD<0> to UPSD<n>, to selectively drive a pull-up sub-driver UPSD<i>. The transfer gates TGP<0> to TGP<n> are provided for the respective pull-up sub-drivers UPSD<0> to UPSD<n> and selectively transfer slew-rate control signals VUPs to the pull-up sub-drivers UPSD<0> to UPSD<n>, based on enable signals ENUP<0> to ENUP<n> and their inverted signals bENUP<0> to bENUP<n>. Each of the transfer gates TGP<0> to TGP<n> may comprise, for example, a CMOS (Complementary Metal Oxide Semiconductor) in which a P-type transistor and an N-type transistor are connected in parallel. At this time, the gates of an N-type transistor and a P-type transistor of each of the transfer gates TGP<0> to TGP<n> receive enable signals ENUP<i> and bENUP<i> which are complementary to each other, respectively. Slew-rate control signals VUPs are transmitted to the gates of the transistors TN34 through the transfer gates TGP<0> to TGP<n> and are used to control the slew rate for the rise of the output data DOUT.

The pull-up selector UPSLCT further includes N-type transistors TN0<0> to TN0<n>, each of which is connected between the gate of a corresponding transistor TN34 and a corresponding power supply PS2. The transistors TN0<0> to TN0<n> are provided for the respective transfer gates TGP<0> to TGP<n>, and apply a low-level voltage VSS to the gates of transistors TN34 in unselected pull-up sub-drivers UPSDs so as to securely place the transistors TN34 in a non-conducting state.

The drive capability (current drive capability) to allow the output data to rise varies depending on the combination of selected pull-up sub-drivers UPSDs. Which pull-up sub-drivers UPSD<i> to select (which enable signals ENUP<i> to activate) is determined, for example, by testing of the semiconductor device prior to shipment, such that the drive capability of the output driver has an appropriate value.

[Configurations of the Pull-Down Sub-Drivers DNSD<0> to DNSD<n> and the Pull-Down Selector DNSLCT]

The pull-down sub-drivers DNSD<0> to DNSD<n> are composed of elements of conducting types opposite to those of the pull-up sub-drivers UPSD<0> to UPSD<n> in order to allow the output data to fall, and the power supply voltage levels are also opposite from those of the pull-up sub-drivers UPSD<0> to UPSD<n>. The configuration of the pull-down sub-drivers DNSD<0> to DNSD<n> will be described in detail below.

Each of the pull-down sub-drivers DNSD<0> to DNSD<n> includes N-type transistors TN30 to TN32 and P-type transistors TP33 and TP34. The transistor TN30 serving as an output transistor is connected between a first power supply PS11 of the pull-down sub-driver and the output wiring line WOUT. The first power supply PS11 of the pull-down sub-driver is a power supply that supplies a low-level voltage VSS. Thus, the power supply PS11 may be the same power supply VSS as the power supply PS2 on the pull-up side.

The transistor TN30 operates to connect the low-level power supply PS11 to the output wiring line WOUT in order to output the logic low. Note that, when low-level data is outputted, the signal bDON has the same logic as the signal DOP. The size of the transistor TN30 varies among the pull-down sub-drivers DNSD<0> to DNSD<n>. The sizes of the transistors TN30 in the pull-down sub-drivers DNSD<0> to DNSD<n> are made different in a binary fashion, such as Wn, $2 \times Wn$, $2^2 \times Wn$ ... $2^n \times Wn$. Namely, the transistor TN30 in a pull-down sub-driver DNSD<i> (i=0 to n) has a size of $2^i \times Wn$. By this, the output driver OD can adjust the drive capability to pull down the output data DOUT, by a combination of pull-down sub-drivers selected from among DNSD<0> to DNSD<n> (hereinafter, also simply referred to as DNSDs).

A gate node NG of the transistor TN30 is connected to the power supply PS11 through the N-type transistor TN31 and is connected to the power supply PS11 through the N-type transistor TN32. That is, the transistors TN31 and TN32 are connected in parallel between the power supply PS11 and the gate node NG. The gate of the transistor TN31 receives an enable signal bENDN<i>. Here, the signal bENDN<i> is an inverted signal of a signal ENDN<i>. The gate of the transistor TN32 receives a signal bDON in common with the gate of the transistor TP33.

When the signal bDON is logic low, the pull-down sub-driver DNSD needs to allow the output data DOUT to fall. However, even if the signal bDON is logic low, when the pull-down sub-driver DNSD<i> is unselected (when the enable signal bENDN<i> is logic high (an inactive state)), the unselected pull-down sub-driver DNSD<i> does not operate. Therefore, the transistor TN31 in the unselected pull-down sub-driver DNSD<i> provides a power supply voltage VSS to the gate node NG so as to securely place the corresponding transistor TN30 in an off state. Namely, the transistor TN31 is a transistor for an unselected pull-down sub-driver that functions to place the transistor TN30 in the unselected pull-down sub-driver DNSD<i> in an off state, based on the enable signal bENDN<i>.

When the signal bDON is logic high (when a pull-up sub-driver UPSD<i> allows the output data DOUT to rise), all of the pull-down sub-drivers DNSD<0> to DNSD<n> need to be placed in an inactive state. Therefore, the transistors TN32 in all of the pull-down sub-drivers DNSD<0> to DNSD<n> provide a power supply voltage VSS to their gate nodes NGs so as to securely place their transistors TN30 in an off state.

Namely, each transistor TN32 functions as a switching transistor which is interposed between the gate node NG of the transistor TN30 and the power supply PS11 to place the transistor TN30 in an off state based on the signal bDON.

Meanwhile, the gate node NG of the transistor TN30 is connected to a second power supply PS12 (VDDQ) of the pull-down sub-driver through the P-type transistors TP33 and TP34. That is, the transistors TP33 and TP34 are connected in series between the gate node NG and the power supply PS12. The second power supply PS12 of the pull-down sub-driver is a power supply that supplies a high-level voltage VDDQ which supplies a higher voltage than that supplied by the first power supply PS11 of the pull-down sub-driver. Therefore, the power supply PS12 may be the same power supply VDDQ as the first power supply PS1 on the pull-up side.

When the signal bDON is logic low, the transistor TP33 provides a voltage VDDQ to the gate node NG so as to securely place the transistor TN30 in an on state. Namely, the transistor TP33 functions as a switching transistor which is interposed between the gate node NG of the transistor TN30 and the power supply PS12 to place the transistor TN30 in an on state based on the signal bDON. As such, the transistors TP33 and TN32 are switching transistors that complementarily operate to perform on/off control of the output transistor TN30 according to the signal bDON.

The transistor TP34 serving as a slew-rate control transistor is connected between the transistor TP33 and the high-level voltage supply PS12 and is controlled by the pull-down selector DNSLCT. At this time, the pull-down selector DNSLCT drives only a transistor(s) TP34 in a single or a plurality of pull-down sub-drivers DNSDs which are selected by an enable signal(s) ENDN<i>, so as to place the transistor (s) TP34 in a conducting state and maintains transistors TP34 in all other unselected pull-down sub-drivers in a non-conducting state. A voltage VDN applied to the gate of the transistor TP34 in the selected pull-down sub-driver DNSD controls the conducting state (on resistance) of the transistor TP34 and controls the rate of voltage rising at the gate node NG. By this, the speed at which the transistor TN30 enters an on state is controlled and thus a slew rate (slope) for the drop of the output voltage DOUT is determined. As such, the transistor TP34 has both the function of being a selection transistor which is placed in a conducting state only when selected by the enable signal ENDN<i> and the function of controlling the slew rate for the drop of the output voltage DOUT.

The pull-down selector DNSLCT has transfer gates TGN<0> to TGN<n>, the number of which is equal to that of the pull-down sub-drivers DNSD<0> to DNSD<n>, to selectively drive a pull-down sub-driver DNSD<i>. The transfer gates TGN<0> to TGN<n> are provided for the respective pull-down sub-drivers DNSD<0> to DNSD<n> and selectively transfer slew-rate control signals VDNs to the pull-down sub-drivers DNSD<0> to DNSD<n>, based on enable signals ENDN<0> to ENDN<n> and their inverted signals bENDN<0> to bENDN<n>. The configuration of the transfer gates TGN<0> to TGN<n> may be basically the same as that of the transfer gates TGP<0> to TGP<n>. The gates of an N-type transistor and a P-type transistor of each of the transfer gates TGN<0> to TGN<n> receive enable signals ENDN<i> and bENDN<i> which are complementary to each other. Slew-rate control signals VDNs are transmitted to the gates of the transistors TP34 through the transfer gates TGN<0> to TGN<n> and are used to control the slew rate for the fall of the output data DOUT.

The pull-down selector DNSLCT further includes P-type transistors TP0<0> to TP0<n>, each of which is connected between the gate of a corresponding transistor TP34 and a corresponding power supply PS12. The transistors TP0<0> to TP0<n> are provided for the respective transfer gates TGN<0> to TGN<n>, and apply a high-level voltage VDDQ to the gates of transistors TP34 in unselected pull-down sub-drivers DNSDs so as to securely place the transistors TP34 in a non-conducting state.

The drive capability (current drive capability) to allow the output data to fall varies depending on the combination of selected pull-down sub-drivers DNSDs. Therefore, which pull-down sub-drivers DNSD<i> to select (which enable signals ENDN<i> to activate) is determined, for example, by testing of the semiconductor device prior to shipment, such that the drive capability of the output driver has an appropriate value.

Figure 4:
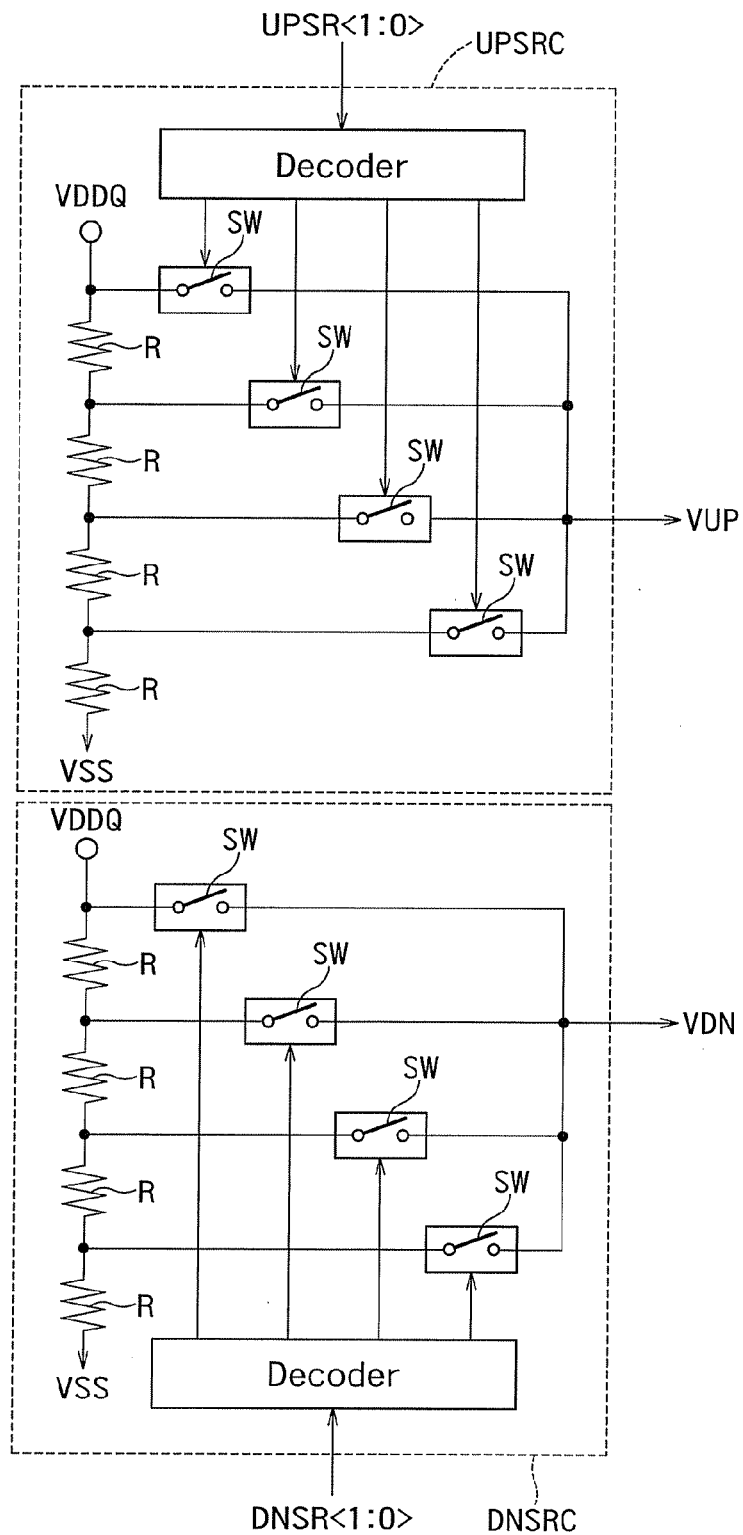
FIG. 4 is a circuit diagram showing exemplary configurations of the slew rate controllers UPSRC and DNSRC that set the voltage value of a slew rate control signal VUP and VDN.

FIG. 4 is a circuit diagram showing exemplary configurations of the slew rate controllers UPSRC and DNSRC that set the voltage value of a slew rate control signal VUP. Each of the slew rate controllers UPSRC and DNSRC includes resistors Rs connected in series between a high-level voltage VDDQ and a low-level voltage VSS; switches SWs, each of which is connected between adjacent resistors Rs; and a decoder that controls the switches SWs according to a slew-rate control bits UPSR<1:0> or DNSR<1:0>. By such a configuration, the slew rate controller UPSRC or DNSRC outputs any of voltages obtained by resistance division between the high-level voltage VDDQ and the low-level voltage VSS, as a slew-rate control signal VUP or VDN. Namely, the slew-rate control signals VUP and VDN are analog signals and the slew-rate control transistors TN34 and TP34 receive analog control.

When a slew rate control of a selected pull-up sub-driver UPSD or pull-down sub-driver DNSD is set as an operating mode, the slew-rate control bits UPSR<1:0> and DNSR<1:0> are changed every operating mode. By this, a switch SW to be placed in an on state is changed and thus the slew-rate control signal VUP or VDN can be changed every operating mode.

Note that the configurations of the slew rate controllers UPSRC and DNSRC are not limited to those shown in FIG. 4, and the configurations can be any as long as slew-rate control signals VUP and VDN are outputted. Note also that the slew-rate control signals UPSR<1:0> and DNSR<1:0> are not limited to 2-bit signals and the number of adjustable levels of the slew-rate control signals VUP and VDN is not limited to 4.

[Pull-Up Operation]

In a pull-up operation of output data DOUT, a predetermined enable signal ENUP<i> is activated to logic high. At this time, a transfer gate TGP<i> associated with the enable signal ENUP<i> is placed in a conducting state, and a transistor TN0<i> associated with the transfer gate TGP<i> is placed in an off state. By this, a slew-rate control signal VUP is transferred to a pull-up sub-driver UPSD<i> and thus the pull-up sub-driver UPSD<i> is selectively driven. A transistor TN34 in the selected pull-up sub-driver UPSD<i> is placed in a conducting state according to the slew rate control signal VUP. On the other hand, a transfer gate TGP and a transistor TN0 associated with an unselected enable signal maintain an off state and an on state, respectively. Therefore, a transistor TN34 in an unselected pull-up sub-driver maintains a non-conducting state.

In addition, by the enable signal ENUP<i> going to logic high, a transistor TP31 in the selected pull-up sub-driver UPSD<i> is placed in an off state. On the other hand, a transistor TP31 in the unselected pull-up sub-driver maintains an on state.

Then, when a signal DOP rises from "L" to "H", a transistor TP32 turns off and a transistor TN33 turns on. Specifically, in the selected pull-up sub-driver UPSD<i>, the transistors TP31 and TP32 are placed in an off state and the transistors TN33 and TN34 are placed in an on state. By this, a gate node PG is discharged to VSS at a slew rate based on the signal VUP. As a result, a transistor TP30 turns on and brings the output data DOUT up to logic high-level voltage VDDQ.

At this time, for example, when enable signals ENUP<0> and ENUP<2> are activated, the total channel width of transistors TP30 in pull-up sub-drivers UPSD<0> and UPSD<2> which are selectively driven is 5Wp (5Wp=Wp+$2^2$Wp). The drive capability to allow output data DOUT to rise is determined by the total sum of the channel widths of pull-up sub-drivers UPSD<i> which are selectively driven.

Note that in the unselected pull-up sub-driver, the transistor TN34 is in an off state and the transistor TP31 is in an on state. Therefore, a high-level voltage VDDQ is applied to a gate node PG of the unselected pull-up sub-driver, regardless of the signal DOP and thus a transistor TP30 maintains an off state.

When an output operation is not performed, the signal DOP is fixed to "L" and the signal bDON is fixed to "H". By this, the gate nodes PG and NG are fixed to a high-level voltage VDDQ and a low-level voltage VSS, respectively, and the transistors TP30 and TN30 maintain a non-conducting state.

[Pull-Down Operation]

In a pull-down operation of output data DOUT, a predetermined enable signal ENDN<i> is activated to logic high. At this time, a transfer gate TGN<i> associated with the enable signal ENDN<i> is placed in a conducting state, and a transistor TP0<i> associated with the transfer gate TGN<i> is placed in an off state. By this, a slew-rate control signal VDN is transferred to a pull-down sub-driver DNSD<i> and thus the pull-down sub-driver DNSD<i> is selectively driven. A transistor TP34 in the selected pull-down sub-driver DNSD<i> is placed in a conducting state according to the slew-rate control signal VDN. On the other hand, a transfer gate TGN and a transistor TP0 associated with an unselected enable signal maintain an off state and an on state, respectively. Therefore, a transistor TP34 in an unselected pull-down sub-driver maintains a non-conducting state.

In addition, by the enable signal ENDN<i> going to logic high, a transistor TN31 in the selected pull-down sub-driver DNSD<i> is placed in an off state. On the other hand, a transistor TN31 in the unselected pull-down sub-driver maintains an on state.

Then, when a signal bDON falls from "H" to "L", a transistor TN32 turns off and a transistor TP33 turns on. Specifically, in the selected pull-down sub-driver DNSD<i>, the transistors TN31 and TN32 are placed in an off state and the transistors TP33 and TP34 are placed in an on state. By this, a gate node NG is charged with VDDQ at a slew rate based on the signal VDN. As a result, a transistor TN30 turns on and brings the output data DOUT down to logic low-level voltage VSS.

At this time, for example, when enable signals ENDN<1> and ENDN<3> are activated, the total channel width of transistors TN30 in pull-down sub-drivers DNSD<1> and DNSD<3> which are selectively driven is 10Wn (10Wn=$2^1$Wn+$2^3$Wn). The drive capability to allow output data DOUT to fall is determined by the total sum of the channel widths of pull-down sub-drivers DNSD<i> which are selectively driven.

Note that in the unselected pull-down sub-driver, the transistor TP34 is in an off state and the transistor TN31 is in an on state. Therefore, a low-level voltage VSS is applied to a gate node NG of the unselected pull-down sub-driver, regardless of the signal bDON and thus a transistor TN30 maintains an off state.

In the semiconductor device according to the present embodiment, the selectors UPSLCT and DNSLCT selectively transfer slew-rate control signals VUP and VDN to sub-drivers UPSD<i> and DNSD<i>. By this, each of transistors TN34 and TP34 that receive the slew-rate control signals VUP and VDN in the sub-drivers UPSD<i> and DNSD<i> can have both the function of controlling the slew rate of an output signal and a switching function of being placed in a conducting state only when selected by the selector UPSLCT or DNSLCT.

Conventionally, as described above, a transistor Tr1 that receives a signal for enabling a sub-driver selectively, a transistor Tr2 that receives a signal for output data, and a transistor Tr3 that receives a signal for controlling the slew rate need to be connected in series.

On the other hand, the semiconductor device according to the present embodiment does not need to separately have a transistor that receives a sub-driver selection signal and a transistor that controls the slew rate of an output signal. Namely, the above-described transistors Tr1 and Tr3 can be merged into a single transistor TN34 (or TP34). By this, the semiconductor device can control the drive capability and the slew rate and can achieve finer lines than those of the conventional one.

To merge the transistor (Tr1) that receives a signal for enabling a sub-driver selectively with a transistor (Tr2) that receives a signal for output data, the selector SLCT needs to select a sub-driver using digital signals DOP and bDON. In this case, a data line that transmits the digital signal DOP (or bDON) needs to be provided for each sub-driver UPSD (or DNSD). A selection of a sub-driver UPSD (or DNSD) is made by selectively providing a digital signal DOP (or bDON) to the sub-driver UPSD (or DNSD) by the logic of the digital signal DOP (or bDON) and an enable signal ENUP (or ENDN). In this case, a signal line for the signal DOP (or bDON) needs to be provided for each sub-driver UPSD (or DNSD). Since the digital signal DOP (or bDON) is rapidly charged and discharged according to the output operating frequency of the semiconductor device, the provision of the signal line for each sub-driver UPSD (or DNSD) causes a timing skew of the signal DOP (or bDON). If the timing skew of the signal DOP (or bDON) occurs in each sub-driver UPSD (or DNSD), then the slew rate of output data DOUT may distort (may be skewed). This adversely affects output waveform quality.

On the other hand, in the present embodiment, sub-drivers UPSD and DNSD are selected using slew-rate control signals VUP and VDN, respectively. Unlike a digital signal for determining the timing of pull-up/pull-down, the slew rate control signals VUP and VDN are signals that control the slew rate of an output signal DOUT itself. Namely, the voltages of the slew-rate control signals VUP and VDN are maintained constant after determining the drive capability and the slew rate. Although the voltages of the slew-rate control signals VUP and VDN may change depending on the operating mode, the slew-rate control signals VUP and VDN do not need to be operated at a high speed and thus are stable signals compared to signals DOP and bDON that transition according to output data. Therefore, there is no problem even if a signal line that transfers the slew-rate control signal VUP or VDN is provided for each sub-driver UPSD (or DNSD). Furthermore, in the present embodiment, a wiring line for a signal DOP (or bDON) is shared by the sub-drivers UPSDs (or DNSDs). Specifically, a single signal line for a signal DOP is shared by the plurality of sub-drivers UPSDs and a single signal line for a signal bDON is shared by the plurality of sub-drivers DNSDs. Therefore, the timing skew of the signal DOP (or bDON) is small and thus the slew rate of output data DOUT does not distort (small skew). As a result, the waveform quality of the semiconductor device according to the present embodiment is favorably maintained.

In the present embodiment, as shown in FIG. 2, the selector SLCT and the slew rate controller SRC are shared by the plurality of output drivers ODs. By this, in the present embodiment, the area overhead resulting from the provision of the selector SLCT and the slew rate controller SRC is small.

Second Embodiment

Figure 5:
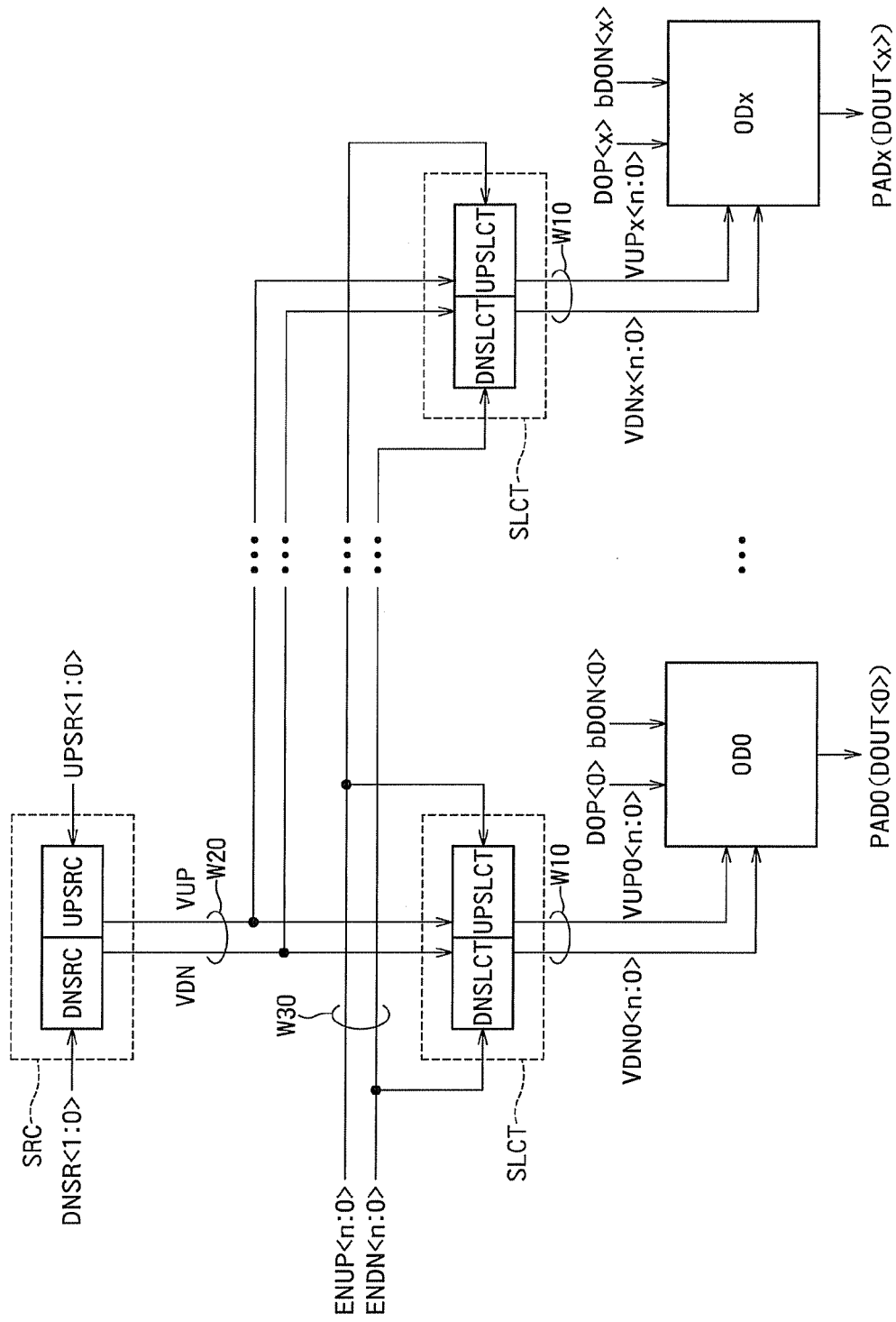
FIG. 5 is a block diagram showing a relationship between output drivers ODs, selectors SLCTs, and a slew rate controller SRC in a semiconductor device according to a second embodiment.

FIG. 5 is a block diagram showing a relationship between output drivers ODs, selectors SLCTs, and a slew rate controller SRC in a semiconductor device according to a second embodiment. The second embodiment differs from the first embodiment in that not only the output drivers ODs but also the selectors SLCTs are provided for respective output pads PADs. Namely, the selectors SLCTs are provided for the respective output drivers ODs. Meanwhile, in the second embodiment, the slew rate controller SRC is shared by the plurality of selectors SLCTs. Other configurations in the second embodiment may be the same as the corresponding ones in the first embodiment.

In the second embodiment, the number of selectors SLCTs is greater than that in the first embodiment. However, since the selectors SLCTs are provided for the respective output drivers ODs, the lengths of wiring lines W10 from each selector SLCT to a corresponding output driver OD are reduced. Namely, signal wiring lines W10 for slew-rate control signals VUPO<n:0> to VUPx<n:0> (hereinafter, also collectively referred to as VUP<n:0>) and VDNO<n:0> to VDNx<n:0> (hereinafter, also collectively referred to as VDN<n:0>) can be made short. In addition, the lengths of the wiring lines W10 can be made equal.

The slew-rate control signals VUP<n:0> and VDN<n:0> are analog signals. Hence, if the length of the wiring lines for the slew-rate control signals VUP<n:0> and VDN<n:0> are long, then the slew-rate control signals VUP<n:0> and VDN<n:0> are likely to be affected by capacitive coupling from other wiring lines or elements. In addition, if the lengths of the wiring lines from the plurality of selectors SLCTs to the plurality of output drivers ODs vary, then the capacitances of the wiring lines for the slew-rate control signals VUP<n:0> and VDN<n:0> vary. If the slew-rate control signals VUP<n:0> and VDN<n:0> become unstable, the slew rate of output data becomes unstable. To deal with this, capacitors (not shown) need to be provided somewhere along the wiring lines for the slew-rate control signals VUP<n:0> and VDN<n:0> to stabilize the signals. In addition, shield wiring lines are also required. Thus, the device increases in size correspondingly.

In contrast, in the second embodiment, the lengths of the wiring lines from the plurality of selectors SLCTs to the plurality of output drivers ODs are equal and short. Thus, the slew-rate control signals VUP<n:0> and VDN<n:0> are less likely to be affected by capacitive coupling from other wiring lines or elements, and variations are small. As a result, the slew rate of output data can be stabilized.

In the configuration shown in FIG. 2, 2(n+1) wiring lines W10 for slew-rate control signals need to be routed from the selector SLCT to the plurality of output drivers ODs. Therefore, if the number of output drivers ODs is large, then the routing lengths of the wiring lines W10 become relatively long and thus considerations such as capacitors for stabilization and shield wiring lines are required, which may increase the size of the semiconductor device. However, in the second embodiment, there is no need to route the wiring lines W10. In the second embodiment, although there is a need to route signal wiring lines W20 from the slew rate controller SRC to the selectors SLTCs, the number of signal wiring lines W20 is two at most. Therefore, if the number of output drivers ODs for which the slew rate controller SRC is provided is large, then the second embodiment is advantageous in terms of achieving a fine-line semiconductor device.

Note that wiring lines W30 for enable signals ENUP and ENDN are routed in the same number as the number of sub-drivers UPSDs and DNSDs. However, since the enable signals ENUP and ENDN are digital signals, the enable signals ENUP and ENDN are immune to capacitive coupling noise, etc. Hence, there is no need to provide capacitors to increase the capacitances of the wiring lines, and achievement of a fine-line semiconductor device is not affected much. Furthermore, enable signals ENUP<n:0> and ENDN<n:0> are used by the plurality of selectors SLCTs in common. However, the enable signals ENUP<n:0> and ENDN<n:0> may be individually provided for each selector SLCT. By this, the output drivers ODs can independently control the drive capability for each output pad PAD and correct an offset between pads. Furthermore, the second embodiment can obtain the same effects as those obtained by the first embodiment.

Third Embodiment

Figure 6:
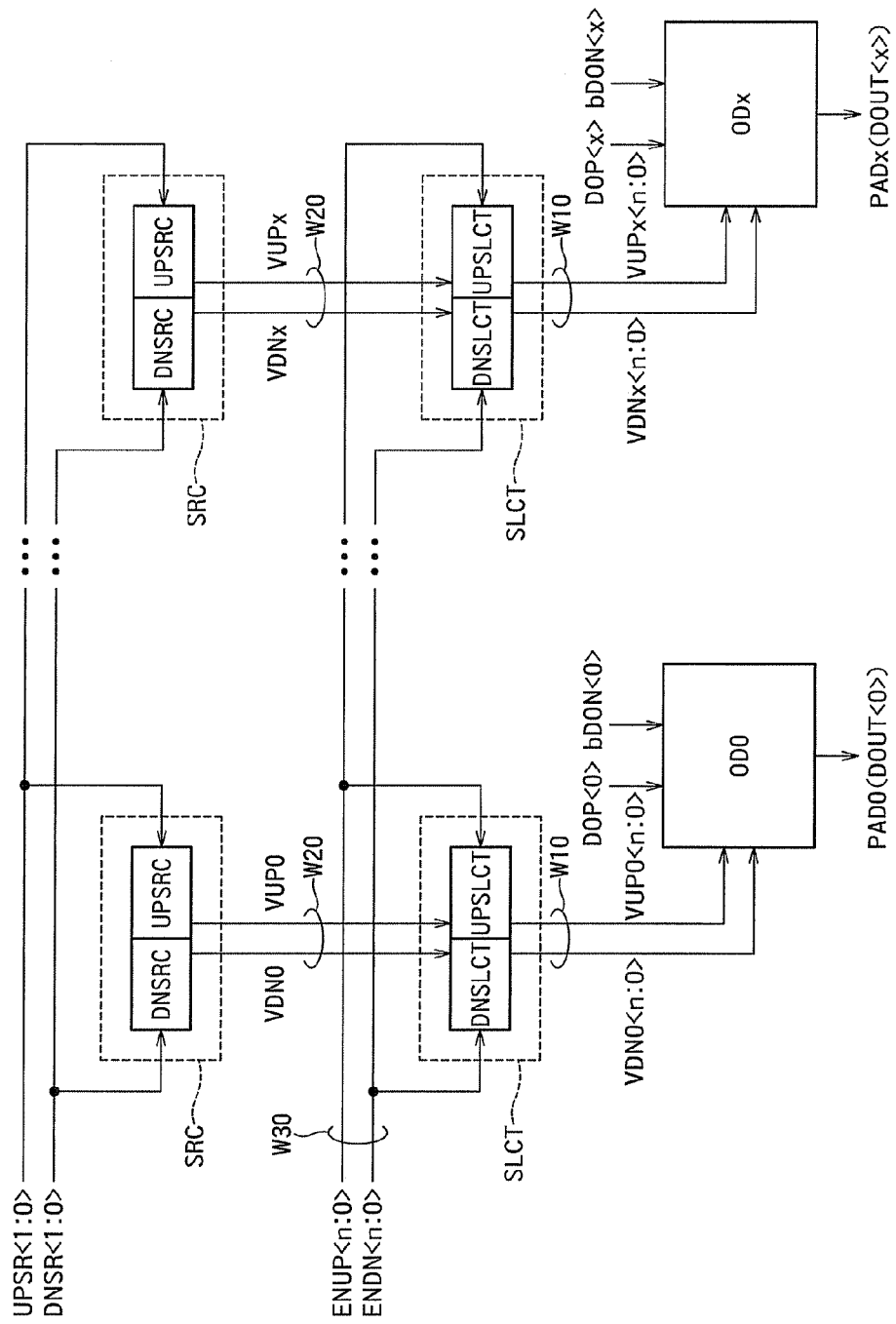
FIG. 6 is a block diagram showing a relationship between output drivers ODs, selectors SLCTs, and slew rate controllers SRCs in a semiconductor device according to a third embodiment.

FIG. 6 is a block diagram showing a relationship between output drivers ODs, selectors SLCTs, and slew rate controllers SRCs in a semiconductor device according to a third embodiment. The third embodiment differs from the second embodiment in that not only the output drivers ODs and the selectors SLCTs but also the slew rate controllers SRCs are provided for respective output pads PADs. Namely, the slew rate controllers SRCs are provided for the respective selectors SLCTs. Other configurations in the third embodiment may be the same as the corresponding ones in the second embodiment.

In the third embodiment, both the slew rate controllers SRCs and the selectors SLCTs can be disposed near the output drivers ODs. By this, the lengths of wiring lines W10 from each selector SLCT to a corresponding output driver OD are reduced. Furthermore, the lengths of wiring lines W20 from each slew rate controller SRC to a corresponding selector SLCT are reduced. Namely, the signal wiring lines W10 that transfer slew-rate control signals VUP<n:0> and VDN<n:0> can be made short. The signal wiring lines W20 that transmit slew-rate control signals VUP0 to VUPx (hereinafter, also simply referred to as VUPs) and VDN0 to VDNx (hereinafter, also simply referred to as VDNs) can be made short, too. In addition, the lengths of the wiring lines W10 can be made equal and the lengths of the wiring lines W20 can also be made equal.

By this, slew-rate control signals transmitted from the slew rate controllers SRCs to the output drivers ODs are less likely to be affected by capacitive coupling from other wiring lines or elements, and variations are small. As a result, the slew rate of output data can be further stabilized and thus output data having a uniform slew rate is outputted from each output pad. Furthermore, the third embodiment can obtain the same effects as those obtained by the second embodiment.

Since both the slew rate controllers SRCs and the selectors SLCTs are provided for the respective output drivers ODs, each slew rate controller SRC outputs slew-rate control signals VUP and VDN such that local variations (e.g., process variations, voltage variations, and temperature variations) in the vicinity of a corresponding output driver OD are reflected in the slew-rate control signals VUP and VDN. Hence, in each output pad, an output with a relatively uniform slew rate can be obtained.

In addition, by changing slew-rate control bits UPSR<1:0> and DNSR<1:0> so as to be independently set for each slew rate controller SRC, an offset between pads can be corrected.

Note that the slew-rate control bits UPSR<1:0> and DNSR<1:0> are digital signals like enable signals ENUP and ENDN. Therefore, for wiring lines for the slew-rate control bits UPSR<1:0> and DNSR<1:0>, too, there is no need to provide capacitors for stabilization, and achievement of a fine-line semiconductor device is not affected much.

Fourth Embodiment

Figure 7:
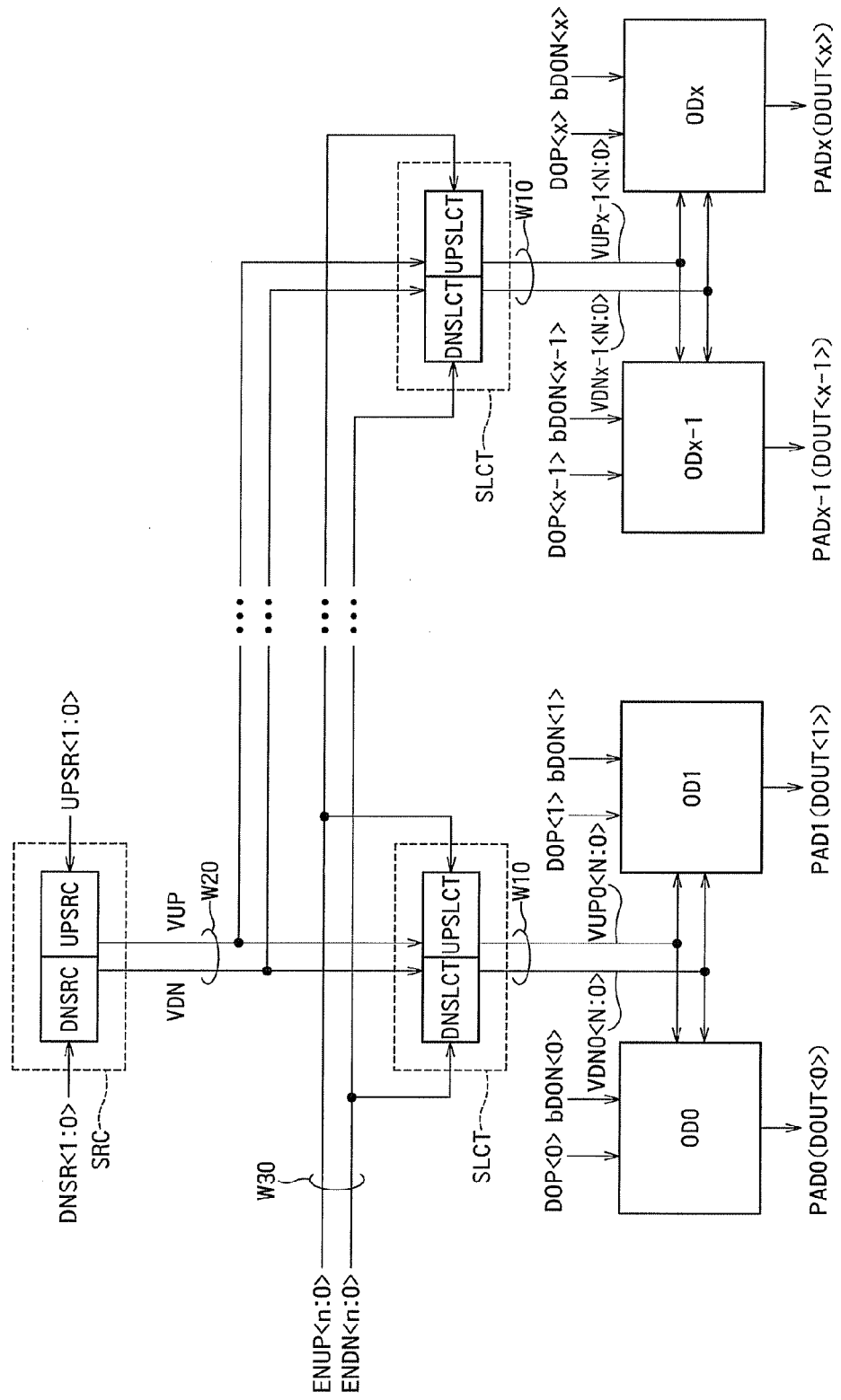
FIG. 7 is a block diagram showing a relationship between output drivers ODs, selectors SLCTs, and a slew rate controller SRC in a semiconductor device according to a fourth embodiment.

FIG. 7 is a block diagram showing a relationship between output drivers ODs, selectors SLCTs, and a slew rate controller SRC in a semiconductor device according to a fourth embodiment. The fourth embodiment differs from the second embodiment in that each selector SLCT is shared by a plurality of adjacent output drivers ODs. Note that the output drivers ODs are provided for respective output pads PADs. Other configurations in the fourth embodiment may be the same as the corresponding ones in the second embodiment.

In general, a plurality of output pads PADs is often disposed adjacent to each other. In this case, a plurality of output drivers ODs is also disposed adjacent to each other. Therefore, even if a selector SLCT is allowed to be shared by a plurality of output drivers ODs disposed adjacent to each other, wiring lines W10 do not become so long and variations are small. In fact, by reducing the number of selectors SLCTs, a fine-line semiconductor device can be achieved.

Therefore, in the fourth embodiment, by allowing a selector SLCT to be shared by a plurality of adjacent output drivers ODs, a finer-line semiconductor device can be achieved and small variations in slew-rate control signals VUP<n:0> and VDN<n:0> can be maintained. The fourth embodiment can further obtain the effects obtained by the second embodiment.

Fifth Embodiment

Figure 8:
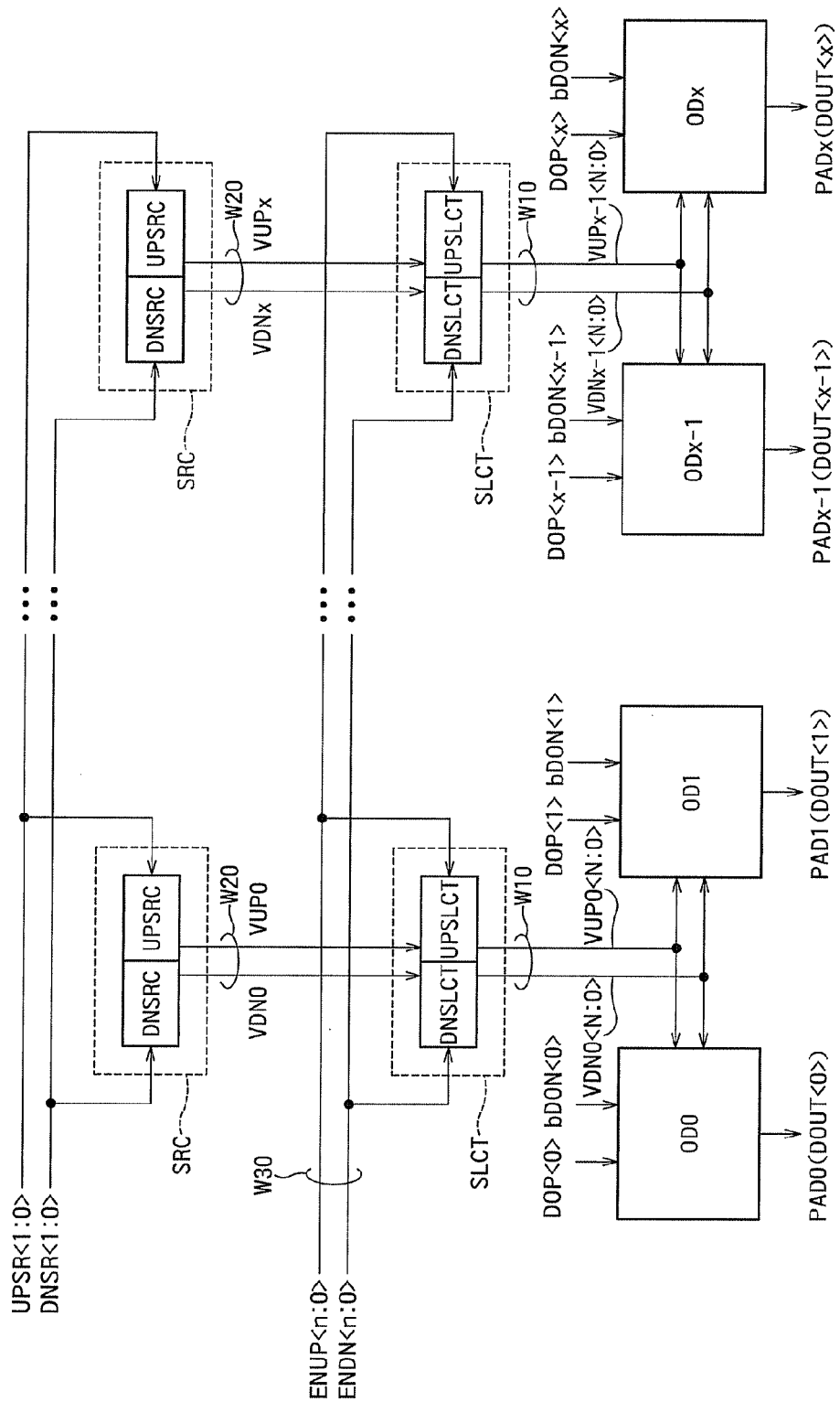
FIG. 8 is a block diagram showing a relationship between output drivers ODs, selectors SLCTs, and slew rate controllers SRCs in a semiconductor device according to a fifth embodiment.

FIG. 8 is a block diagram showing a relationship between output drivers ODs, selectors SLCTs, and slew rate controllers SRCs in a semiconductor device according to a fifth embodiment. The fifth embodiment differs from the third embodiment in that each selector SLCT is shared by a plurality of adjacent output drivers ODs. Note that the output drivers ODs are provided for respective output pads PADs. Other configurations in the fifth embodiment may be the same as the corresponding ones in the third embodiment. The fifth embodiment is a combination of the third embodiment and the fourth embodiment.

In the fifth embodiment, too, as in the fourth embodiment, by allowing a selector SLCT to be shared by a plurality of adjacent output drivers ODs, a finer-line semiconductor device can be achieved and small variations in slew-rate control signals VUP<n:0> and VDN<n:0> can be maintained. The fifth embodiment can further obtain the effects obtained by the third embodiment.

In the fourth and fifth embodiments, the number of output drivers ODs provided for a single selector SLCT is not limited.

Furthermore, the configurations shown in FIGS. 2 and 5 to 8 may be partially applied to a single semiconductor device.

The following sixth to tenth embodiments are embodiments of output drivers ODs and selectors. The sixth to tenth embodiments can be applied to the above-described second to fifth embodiments.

Sixth Embodiment

Figure 9A:
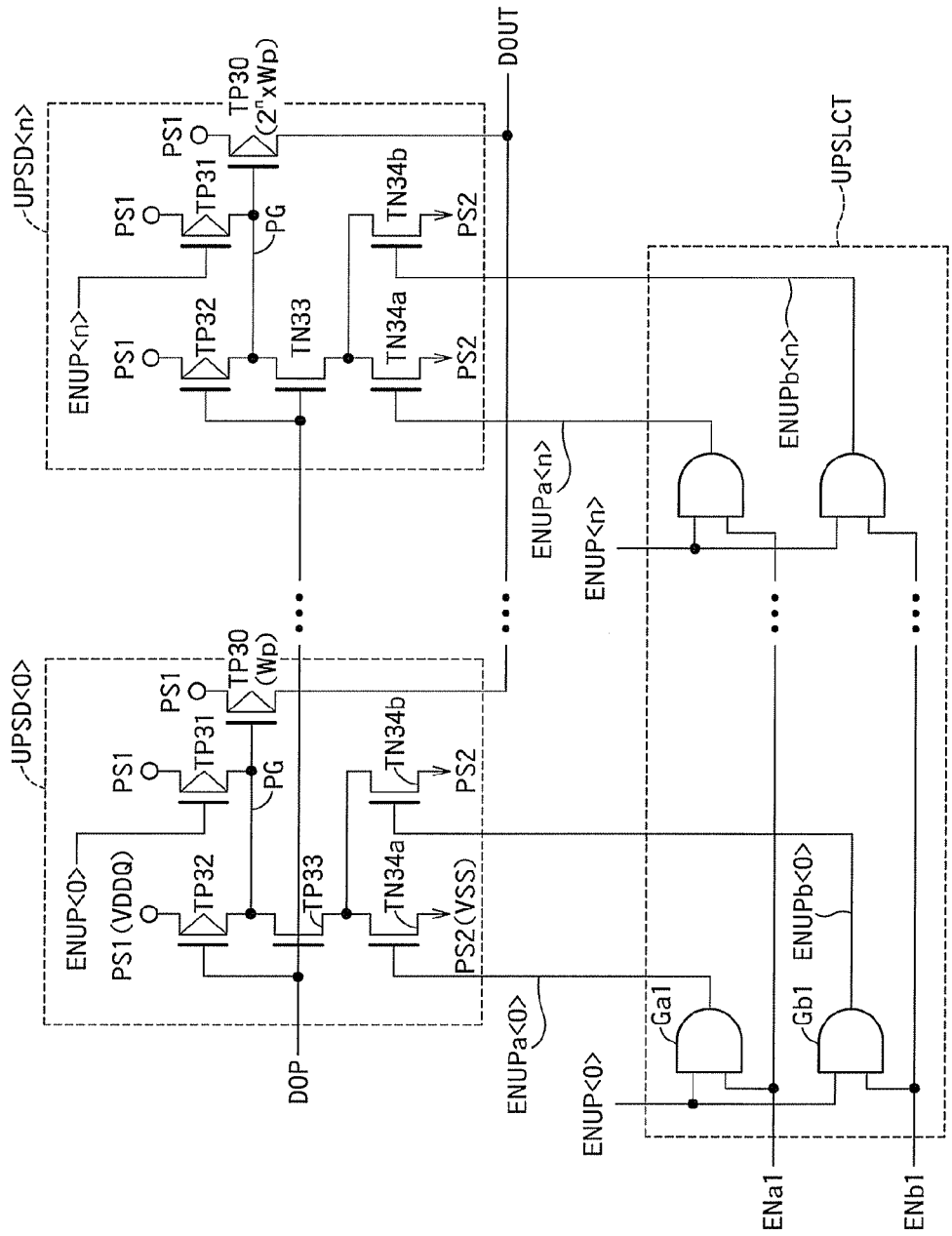
FIGS. 9A and 9B are circuit diagrams showing more detailed configurations of an output driver OD, a pull-up selector UPSLCT, and a pull-down selector DNSLCT according to a sixth embodiment.
Figure 9B:
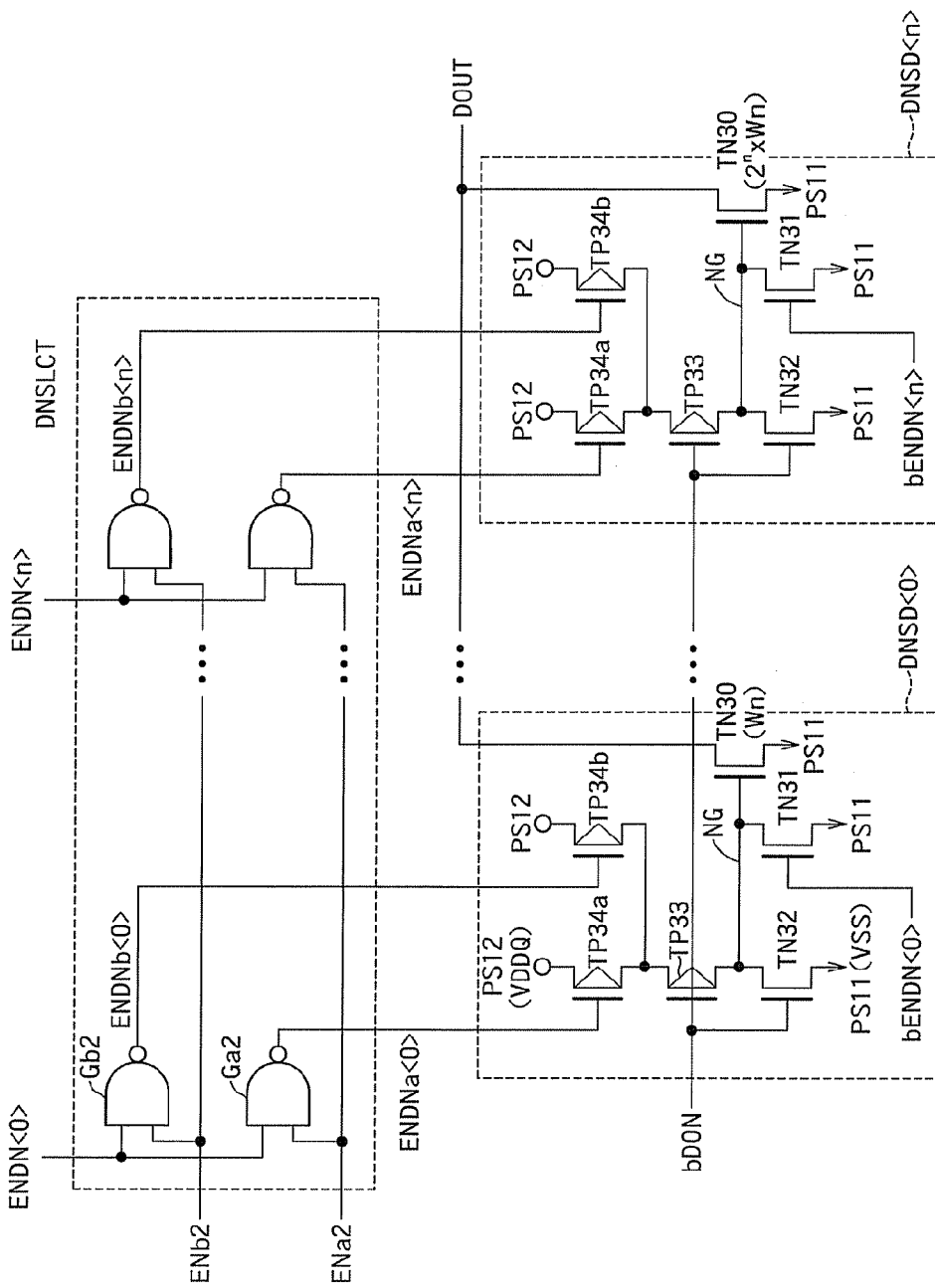

FIGS. 9A and 9B are circuit diagrams showing more detailed configurations of an output driver OD, a pull-up selector UPSLCT, and a pull-down selector DNSLCT according to a sixth embodiment. FIG. 9A shows a configuration of the pull-up side and FIG. 9B shows a configuration of the pull-down side. Although, for convenience sake, the configuration of the pull-up side and the configuration of the pull-down side are shown in different drawings, a signal line for output data DOUT and power supplies VDDQ and VSS in FIGS. 9A and 9B are common. By this, the configurations shown in FIGS. 9A and 9B can together allow output data to rise or fall.

The output drivers ODs according to the sixth embodiment differ from the output drivers ODs of the first embodiment (FIG. 3) in that each of slew-rate control transistors (TN34 and TP34) is divided into a plurality of transistors. Other configurations of the output drivers ODs of the sixth embodiment may be the same as the corresponding ones of the output drivers ODs of the first embodiment.

In the sixth embodiment, a slew-rate control transistor on the pull-up side is divided into two transistors TN34a and TN34b and a slew-rate control transistor on the pull-down side is also divided into two transistors TP34a and TP34b.

Only the gate electrodes of the transistors TN34a and TN34b on the pull-up side shown in FIG. 9A need to be divided and the sources and drains thereof may be common in order to achieve fine lines. The transistors TN34a and TN34b are individually on/off controlled to control the slew rate of a transistor TP30. To increase the slew rate of the transistor TP30, both the transistors TN34a and TN34b are turned on to rapidly change the voltage at a gate node PG. On the other hand, to reduce the slew rate of the transistor TP30, one of the transistors TN34a and TN34b is turned on to slowly change the voltage at the gate node PG. The sizes (gate widths) of the transistors TN34a and TN34b may be equal or may be different. For example, when the gate width of the transistor TN34a is WG, the gate width of the transistor TN34b may be made different therefrom, such as 2*WG. By this, the slew rate of the transistor TP30 can be controlled in three levels (WG, 2*WG, and 3*WG) only by on/off control of the transistors TN34a and TN34b. As such, the transistors TN34a and TN34b are logic controlled and do not receive analog control such as that of a transistor TN34 shown in FIG. 3. Therefore, in the sixth embodiment, slew rate controllers shown in FIG. 4 are not required.

The transistors TP34a and TP34b on the pull-down side shown in FIG. 9B differ from the transistors TN34a and TN34b only in conducting type and basically have the same configurations as the transistors TN34a and TN34b. Therefore, only the gate electrodes of the transistors TP34a and TP34b need to be divided and the sources and drains thereof may be common. The transistors TP34a and TP34b are individually on/off controlled to control the slew rate of a transistor TN30. The sizes of the transistors TP34a and TP34b may be equal or may be different. When the sizes of the transistors TP34a and TP34b are made different, the slew rate of the transistor TN30 can be controlled in three levels. As such, the transistors TP34a and TP34b are also logic controlled. Therefore, in the sixth embodiment, analog signals VUP and VDN can be omitted.

As shown in FIG. 9A, in order to individually logically-control the transistors TN34a and TN34b, the pull-up selector circuit UPSLCT is composed of a logic circuit. The pull-up selector circuit UPSLCT accepts as input an enable signal ENUP<i> and enable signals ENa1 and ENb1 and selectively drives transistors TN34a and/or TN34b in a pull-up sub-driver UPSD<i>, according to the results of computation of the signals. The enable signal ENUP<i> selects the pull-up sub-driver UPSD<i> to be driven, and the enable signals ENa1 and ENb1 select the slew-rate control transistors TN34a and/or TN34b to be driven. For example, when the enable signal ENUP<i> and the enable signal ENa1 are logic high, the transistor TN34a in the pull-up sub-driver UPSD<i> is driven by an AND gate Ga1. When the enable signal ENUP<i> and the enable signal ENb1 are logic high, the transistor TN34b in the pull-up sub-driver UPSD<i> is driven by an AND gate Gb1.

The transistors TP34a and TP34b shown in FIG. 9B are logically-controlled by the pull-down selector circuit DNSLCT. The pull-down selector circuit DNSLCT differs from the pull-up selector circuit UPSLCT in FIG. 9A in that it is composed of NAND gates Ga2. The pull-down selector circuit DNSLCT accepts as input an enable signal ENDN<i> and enable signals ENa2 and ENb2 and selectively drives transistors TP34a and/or TP34b in a pull-down sub-driver DNSD<i>, according to the results of computation of the signals. The enable signal ENDN<i> selects the pull-down sub-driver DNSD<i> to be driven, and the enable signals ENa2 and ENb2 select the slew-rate control transistors TP34a and/or TP34b to be driven. For example, when the enable signal ENDN<i> and the enable signal ENa2 are logic high, the transistor TP34a in the pull-down sub-driver DNSD<i> is driven by a NAND gate Ga2. When the enable signal ENDN<i> and the enable signal ENb2 are logic high, the transistor TP34b in the pull-down sub-driver DNSD<i> is driven by a NAND gate Gb2.

The output drivers ODs of the sixth embodiment do not differ from those of the first embodiment, except that each slew-rate control transistor is divided into transistors and digital signals are provided to the gate potentials of the transistors. Therefore, the sixth embodiment can obtain the same effects as those obtained by the first embodiment. Note that although each slew-rate control transistor is divided into transistors, only the gate electrodes thereof are divided and the sources and drains thereof are common. Therefore, the overall size of the slew-rate control transistors in the sixth embodiment does not much differ from that in the first embodiment and the sixth embodiment is the same as the first embodiment in terms of that it is suitable for achieving fine lines over the conventional case.

Seventh Embodiment

Figure 10A:
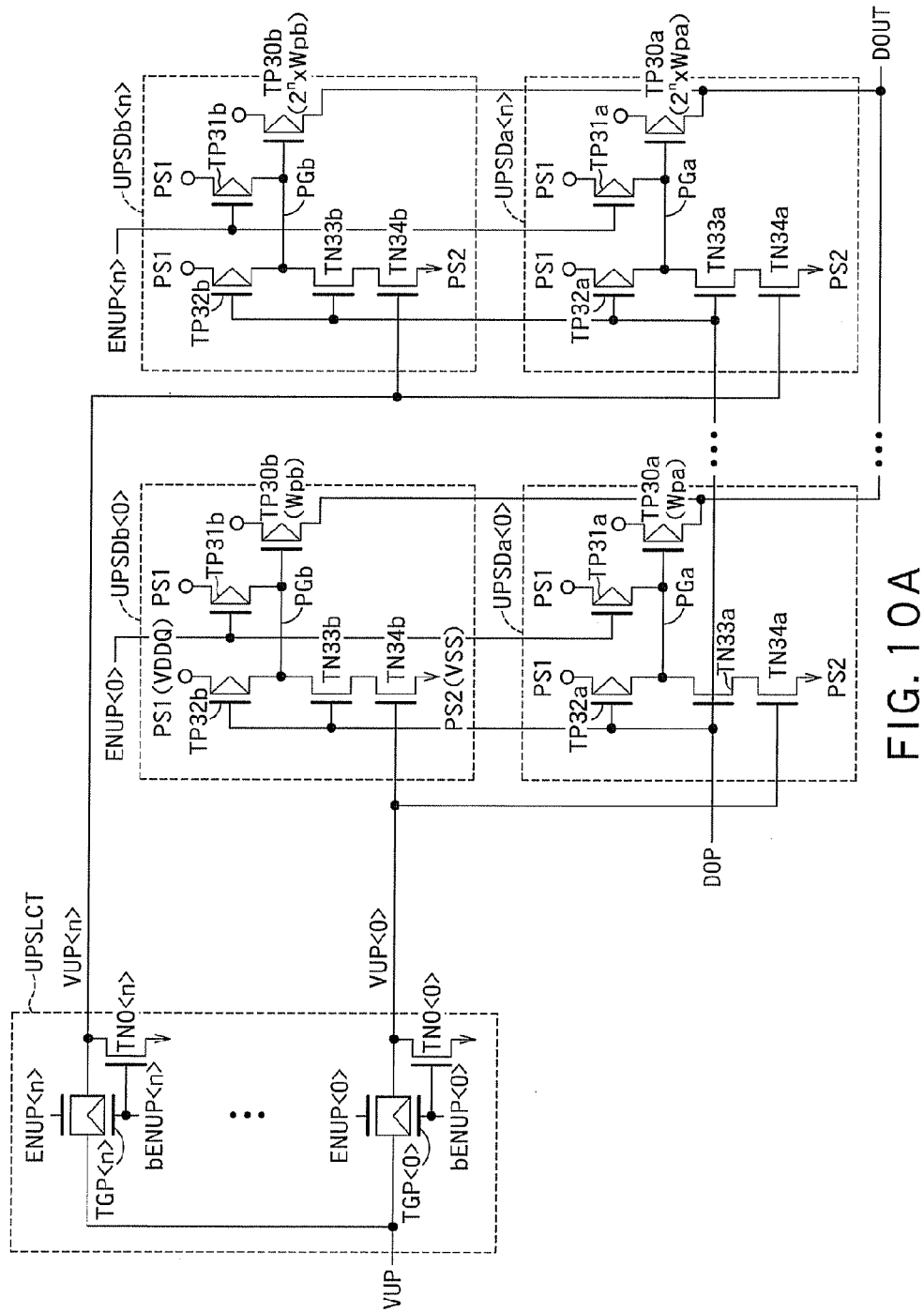
FIGS. 10A and 10B are circuit diagrams showing more detailed configurations of an output driver OD, a pull-up selector UPSLCT, and a pull-down selector DNSLCT according to a seventh embodiment.
Figure 10B:
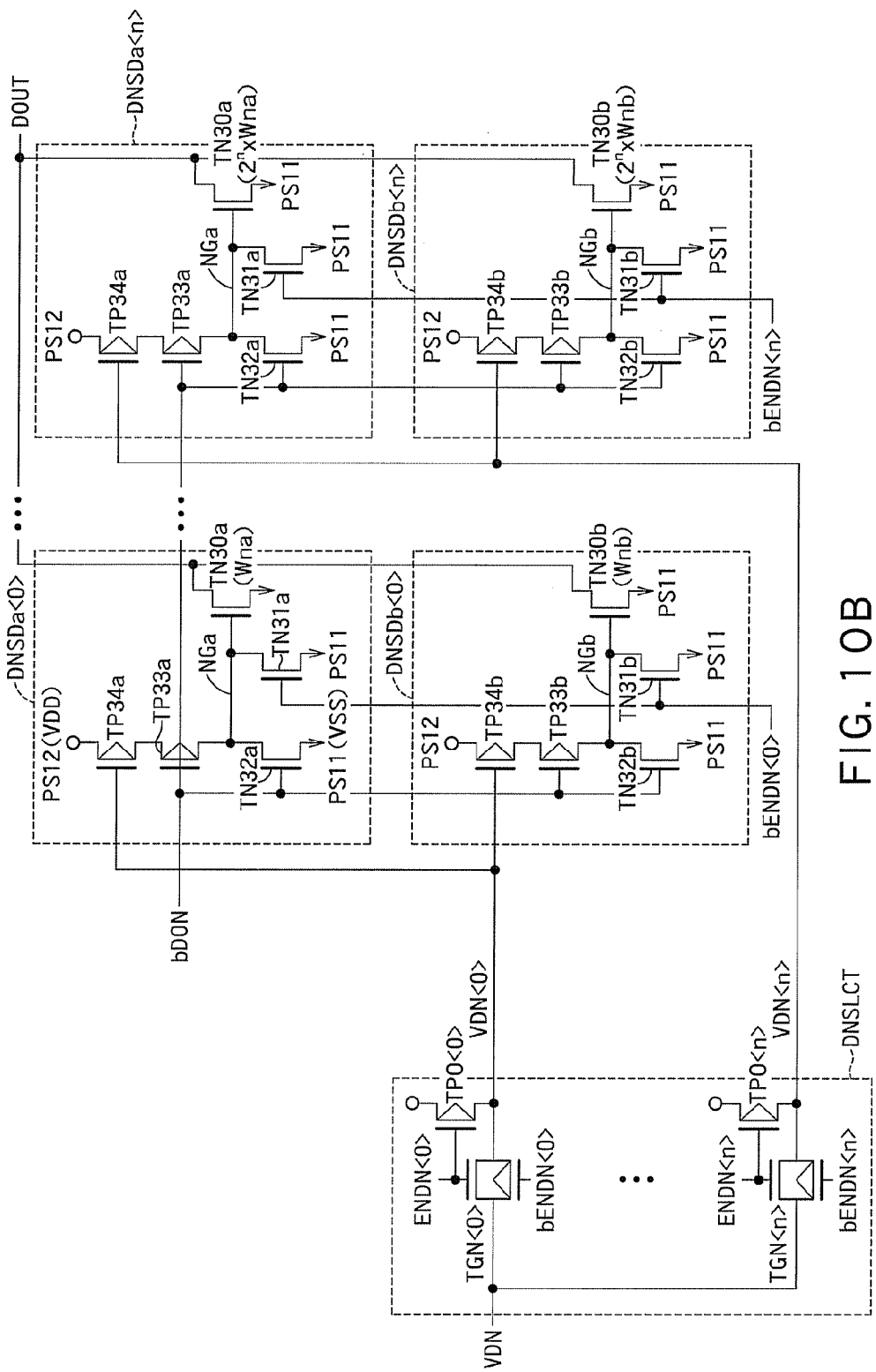

FIGS. 10A and 10B are circuit diagrams showing more detailed configurations of an output driver OD, a pull-up selector UPSLCT, and a pull-down selector DNSLCT according to a seventh embodiment. FIG. 10A shows a configuration of the pull-up side and FIG. 10B shows a configuration of the pull-down side. Although, for convenience sake, the configuration of the pull-up side and the configuration of the pull-down side are shown in different drawings, a signal line for output data DOUT and power supplies VDDQ and VSS in FIGS. 10A and 10B are common. By this, the configurations shown in FIGS. 10A and 10B can together allow output data to rise or fall.

In the seventh embodiment, each pull-up sub-driver UPSD<i> is divided into a plurality of pull-up sub-drivers (UPSDa<i> and UPSDb<i>) and each pull-down sub-driver DNSD<i> is also divided into a plurality of pull-down sub-drivers (DNSDa<i> and DNSDb<i>). The pull-up sub-drivers UPSDa<i> and UPSDb<i> form a group and are connected in parallel with each other. The pull-down sub-drivers DNSDa<i> and DNSDb<i> also form a group and are connected in parallel with each other.

A group of pull-up sub-drivers UPSDa<0> and UPSDb<0> and a group of pull-down sub-drivers DNSDa<0> and DNSDb<0> are shown as an example below.

In the group of pull-up sub-drivers UPSDa<0> and UPSDb<0>, as shown in FIG. 10A, transistors TP30a and TP30b are connected in parallel with each other. Note, however, that a gate node PGa of the transistor TP30a and a gate node PGb of the transistor TP30b are separated from each other. Transistors TP31a and TP31b are respectively connected between a power supply PS1 and the gate nodes PGa and PGb, and their gates receive an enable signal ENUP<0> in common. The gate nodes PGa and PGb are respectively connected to a series circuit composed of transistors TP32a, TN33a, and TN34a and a series circuit composed of transistors TP32b, TN33b, and TN34b. The gates of the transistors TP32a, TN33a, TP32b, and TN33b receive a signal DOP in common. The gates of the transistors TN34a and TN34b receive a slew-rate control signal VUP<0> in common.

The pull-up selector UPSLCT does not select one of the pull-up sub-drivers UPSDa<0> and UPSDb<0> but selects the pull-up sub-drivers UPSDa<0> and UPSDb<0> as one group UPSD<0> and simultaneously drives them.

A gate width Wpa of the transistor TP30a may differ from a gate width Wpb of the transistor TP30b. In this case, a capacitance CPGa at the gate node PGa differs from a capacitance CPGb at the gate node PGb. In addition, a gate width WN34a of the transistor TN34a may differ from a gate width WN34b of the transistor TN34b. By this, the current drive capability of the transistor TN34a differs from the current drive capability of the transistor TN34b. The difference in capacitance between the gate nodes PGa and PGb and the difference in current drive capability between the transistors TN34a and TN34b make the discharge rates of the gate nodes PGa and PGb of the transistors TP30a and TP30b different from each other. If CPGa/CPGb is equal to WN34a/WN34b, then the discharge rates of the gate nodes PGa and PGb become equal and thus a condition for making those discharge rates different from each other is to make CPGa/CPGb different from WN34a/WN34b. By making the slew rates of outputs with which the transistors TP30a and TP30b are concerned different from each other, in the seventh embodiment, a sudden rise in the voltage of output data DOUT is suppressed and as a result, ringing or reflection of an output signal can be prevented.

The configurations of other pull-up sub-driver groups (UPSDa<1> and UPSDb<1>) to (UPSDa<n> and UPSDb<n>) can be easily analogized from the description of the above-described pull-up sub-driver group (UPSDa<0> and UPSDb<0>) and thus description thereof is omitted.

In the group of pull-down sub-drivers (DNSDa<0> and DNSDb<0>), as shown in FIG. 10B, transistors TN30a and TN30b are connected in parallel with each other. Note, however, that a gate node NGa of the transistor TN30a and a gate node NGb of the transistor TN30b are separated from each other. Transistors TN31a and TN31b are respectively connected between a power supply PS11 and the gate nodes NGa and NGb, and their gates receive an enable signal bENDN<0> in common. The gate nodes NGa and NGb are respectively connected to a series circuit composed of transistors TN32a, TP33a, and TP34a and a series circuit composed of transistors TN32b, TP33b, and TP34b. The gates of the transistors TN32a, TP33a, TN32b, and TP33b receive a signal bDON in common. The gates of the transistors TP34a and TP34b receive a slew-rate control signal VDN<0> in common.

The pull-down selector DNSLCT does not select one of the pull-down sub-drivers DNSDa<0> and DNSDb<0> but selects the pull-down sub-drivers DNSDa<0> and DNSDb<0> as one group DNSD<0> and simultaneously drives them.

A gate width Wna of the transistor TN30a may differ from a gate width Wnb of the transistor TN30b. In this case, a capacitance CNGa at the gate node NGa differs from a capacitance CNGb at the gate node NGb. In addition, a gate width WP34a of the transistor TP34a may differ from a gate width WP34b of the transistor TP34b. By this, the current drive capability of the transistor TP34a differs from the current drive capability of the transistor TP34b. The difference in capacitance between the gate nodes NGa and NGb and the difference in current drive capability between the transistors TP34a and TP34b make the charge rates of the gate nodes NGa and NGb of the transistors TN30a and TN30b different from each other. If CNGa/CNGb is equal to WP34a/WP34b, then the charge rates of the gate nodes NGa and NGb become equal and thus a condition for making those charge rates different from each other is to make CNGa/CNGb different from WP34a/WP34b. By making the slew rates of outputs with which the transistors TN30a and TN30b are concerned different from each other, in the seventh embodiment, a sudden rise in the voltage of output data DOUT is suppressed and as a result, ringing or reflection of an output signal can be prevented.

The configurations of other pull-down sub-driver groups (DNSDa<1> and DNSDb<1>) to (DNSDa<n> and DNSDb<n>) can be easily analogized from the description of the above-described pull-down sub-driver group (DNSDa<0> and DNSDb<0>) and thus description thereof is omitted.

Figure 11A:
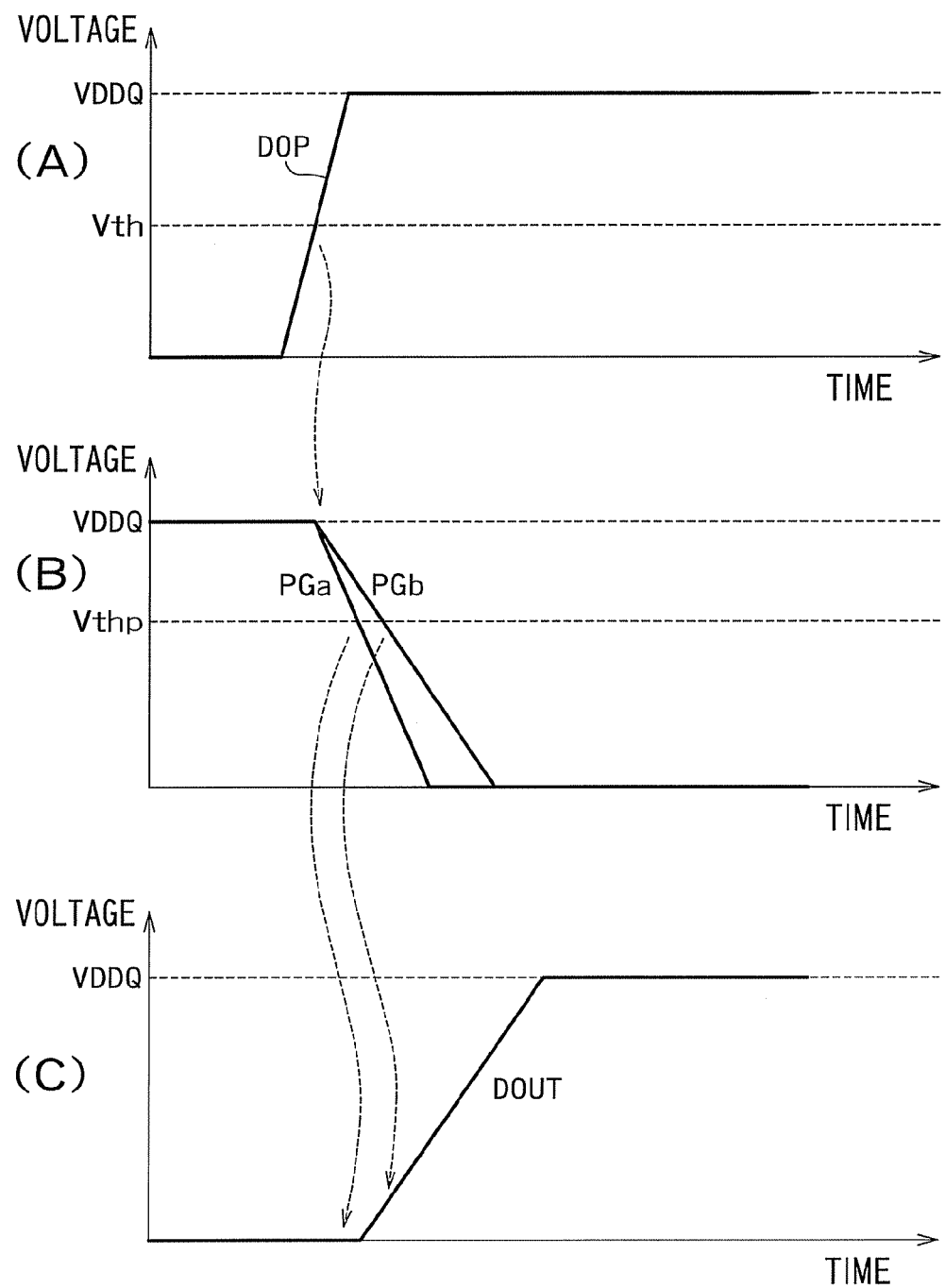
FIGS. 11A and 11B are timing diagrams showing the operations of an output driver OD of the seventh embodiment.
Figure 11B:
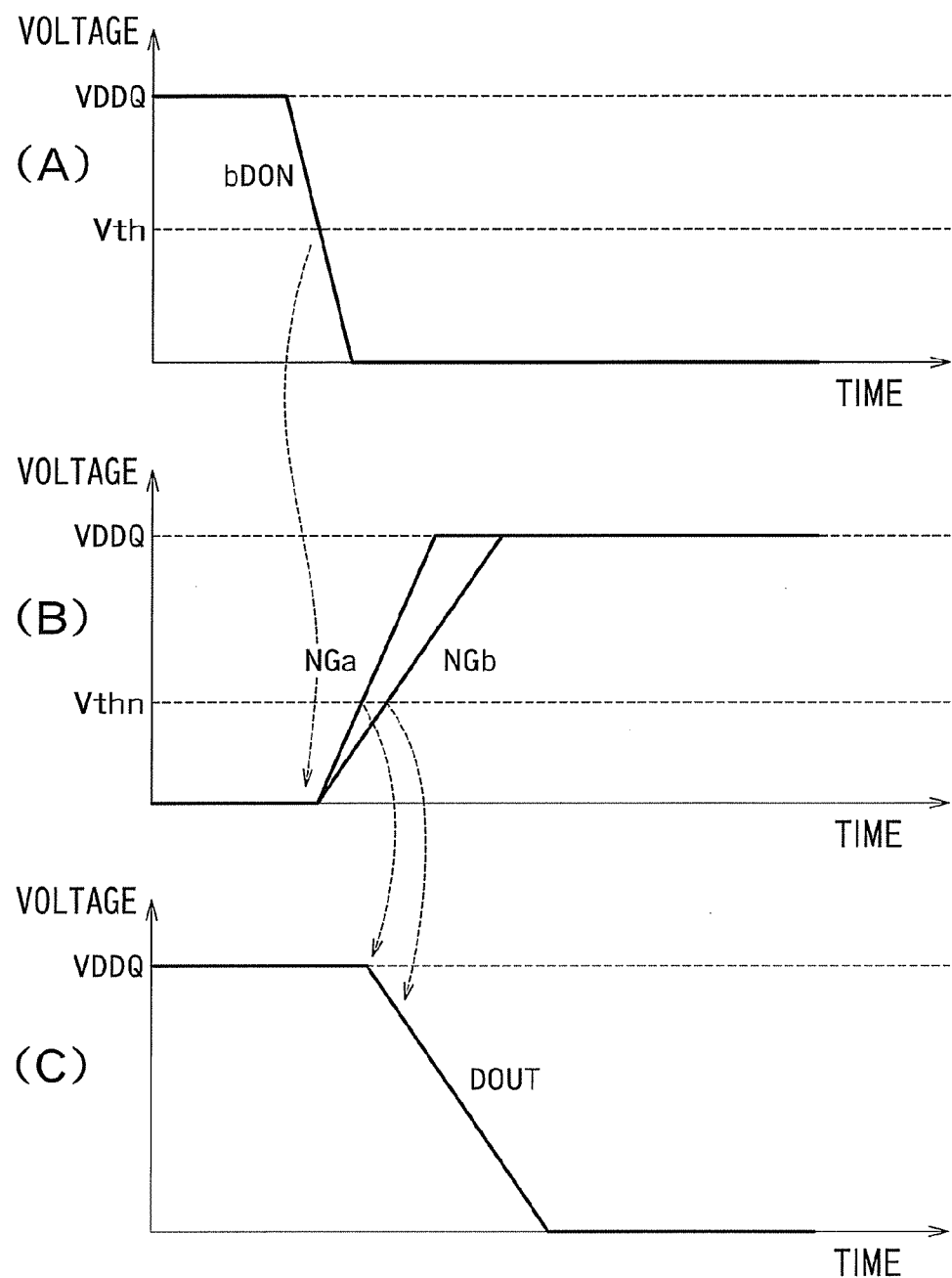

FIGS. 11A and 11B are timing diagrams showing the operations of an output driver OD of the seventh embodiment. For example, in the pull-up sub-drivers UPSDa<0> and UPSDb<0>, as shown in FIG. 11A, when a signal DOP rises ((A) of FIG. 11A), the voltages at the gate nodes PGa and PGb drop according to the conducting states of the transistors TN34a and TN34b, respectively ((B) of FIG. 11A). At this time, since a signal VUP<i> is inputted to the gates of the transistors TN34a and TN34b in common, the slope of voltage drop at the gate node PGa and the slope of voltage drop at the gate node PGb differ from each other due to the difference in size between the transistors TN34a and TN34b or the difference in capacitance between the gate nodes PGa and PGb. By this, it is possible to prevent ringing or reflection of an output signal which is caused by a sudden, large current flow resulted from simultaneous turn-on of transistors TP30a and TP30b.

For example, as shown in FIG. 11B, when a signal bDON falls ((A) of FIG. 11B), the voltages at the gate nodes NGa and NGb rise according to the conducting states of the transistors TP34a and TP34b, respectively ((B) of FIG. 11B). At this time, since a signal VDN<i> is inputted to the gates of the transistors TP34a and TP34b in common, the slope of voltage rise at the gate node NGa and the slope of voltage rise at the gate node NGb differ from each other due to the difference in size between the transistors TP34a and TP34b or the difference in capacitance between the gate nodes NGa and NGb. By this, It is possible to prevent ringing or reflection of an output signal which is caused by a sudden, large current flow resulted from simultaneous turn-on of the transistors TN30a and TN30b.

As such, in the seventh embodiment, in sub-drivers UPSDa<i> and UPSDb<i> (DNSDa<i> and DNSDb<i>), the slew rates of outputs with which the sub-drivers UPSDa<i> and UPSDb<i> (DNSDa<i> and DNSDb<i>) are concerned can be made different from each other using signals of the same level VUP<i> (VDN<i>) without shifting the timing of a signal DOP (bDON). As a result, a current peak in a transition of output data is suppressed, enabling to prevent ringing or reflection of an output signal.

Note that although in the seventh embodiment each pull-up sub-driver UPSD<i> is divided into two pull-up sub-drivers and each pull-down sub-driver DNSD<i> is also divided into two pull-down sub-drivers, they may be divided into three or more pull-up sub-drivers or pull-down sub-drivers.

Although each of the sub-drivers UPSD<i> and DNSD<i> is divided into sub-drivers, since there are many transistors connected in parallel and transistors whose gates are common, the layout area does not increase much over those in other embodiments.

Eighth Embodiment

Figure 12A:
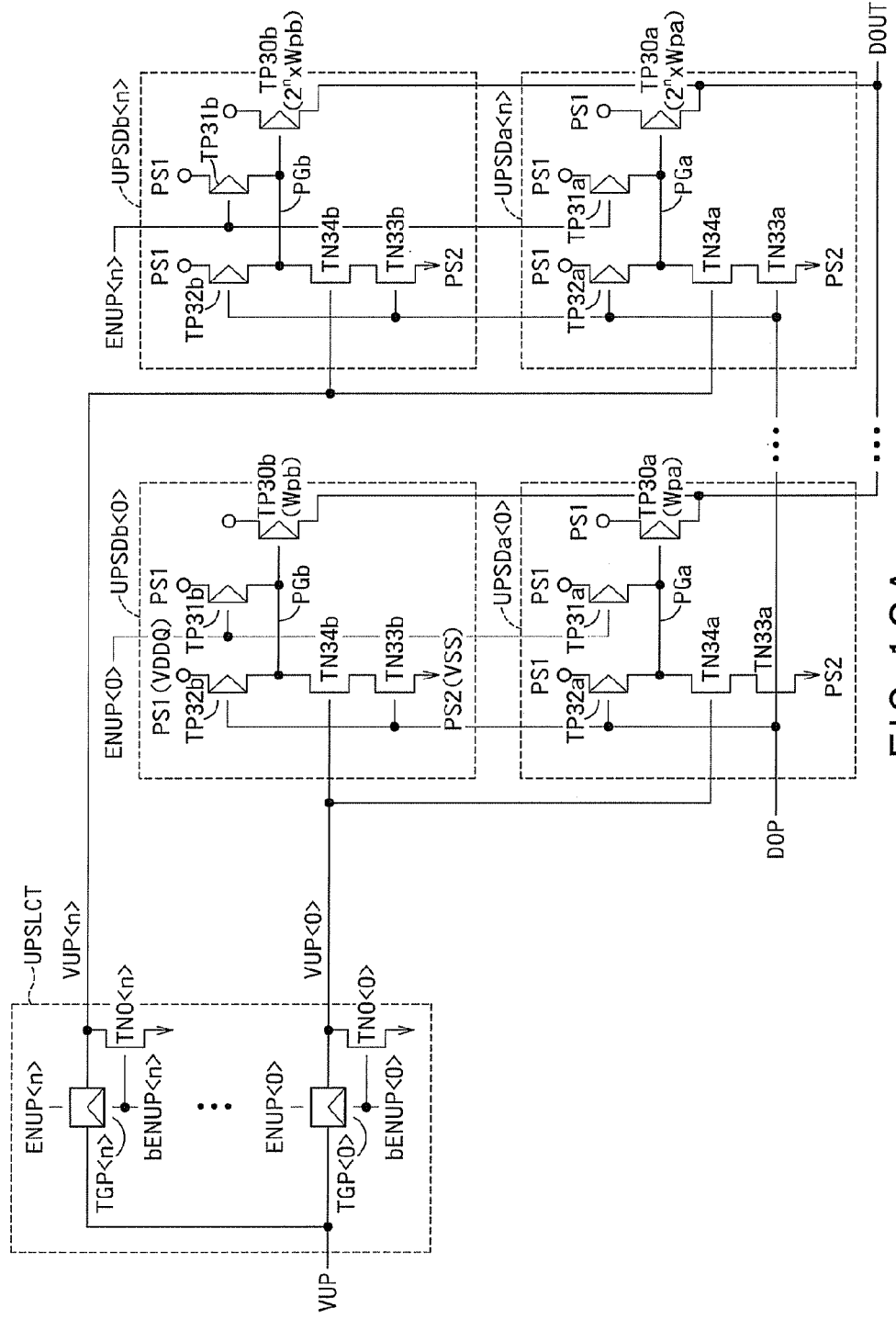
FIGS. 12A and 12B are circuit diagrams showing more detailed configurations of an output driver OD, a pull-up selector UPSLCT, and a pull-down selector DNSLCT according to an eighth embodiment.
Figure 12B:
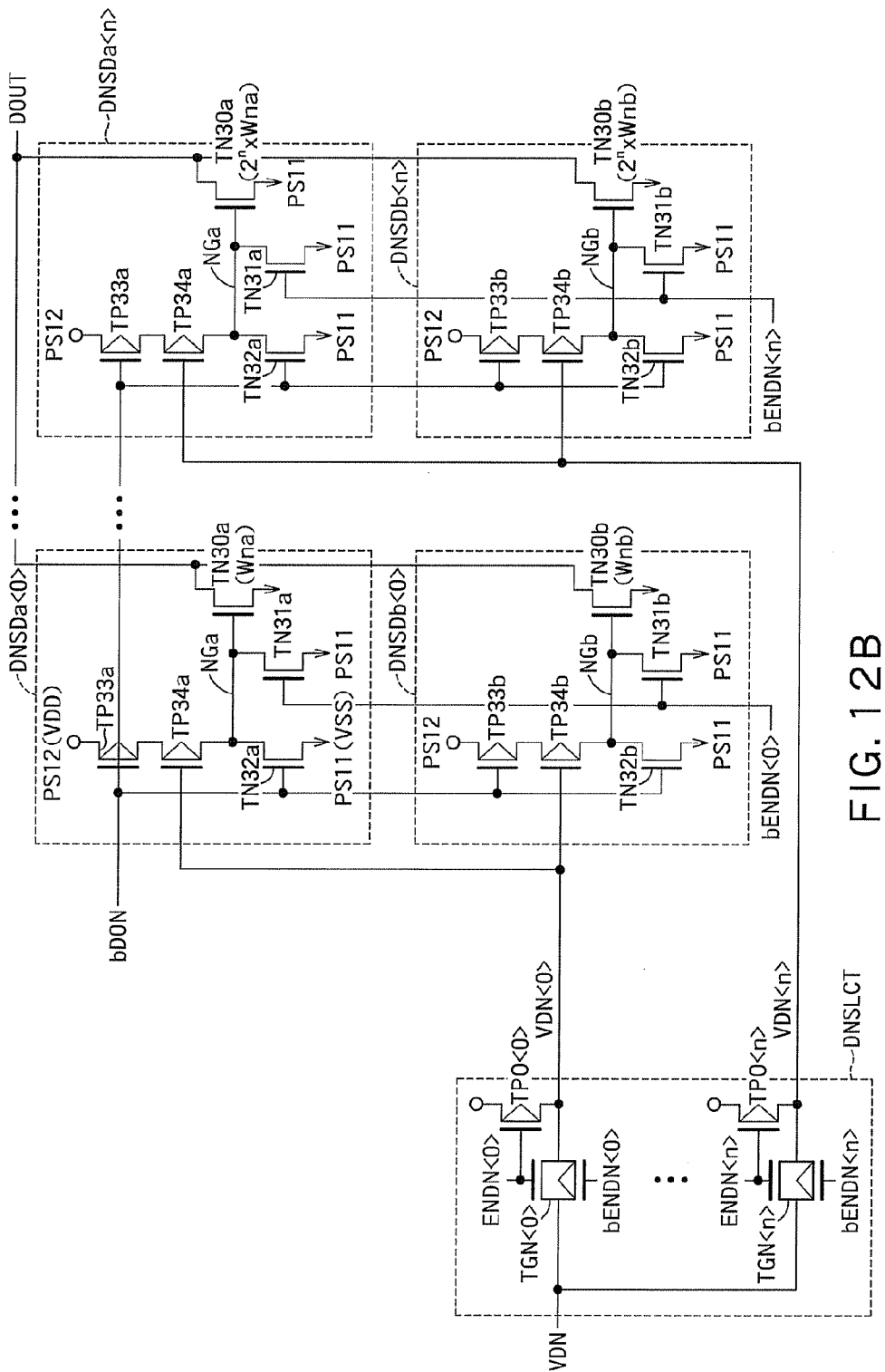

FIGS. 12A and 12B are circuit diagrams showing more detailed configurations of an output driver OD, a pull-up selector UPSLCT, and a pull-down selector DNSLCT according to an eighth embodiment. In the eighth embodiment, the connection relationships between switching transistors (TN33a and TN33b) and between slew-rate control transistors (TN34a and TN34b) are opposite to those in the seventh embodiment. In addition, the connection relationships between switching transistors (TP33a and TP33b) and between slew-rate control transistors (TP34a and TP34b) are opposite to those in the seventh embodiment. Other configurations in the eighth embodiment may be the same as the corresponding ones in the seventh embodiment. In addition, operations in the eighth embodiment are the same as those in the seventh embodiment. Therefore, the eighth embodiment can obtain the same effect as that obtained by the seventh embodiment.

Ninth Embodiment

Figure 13A:
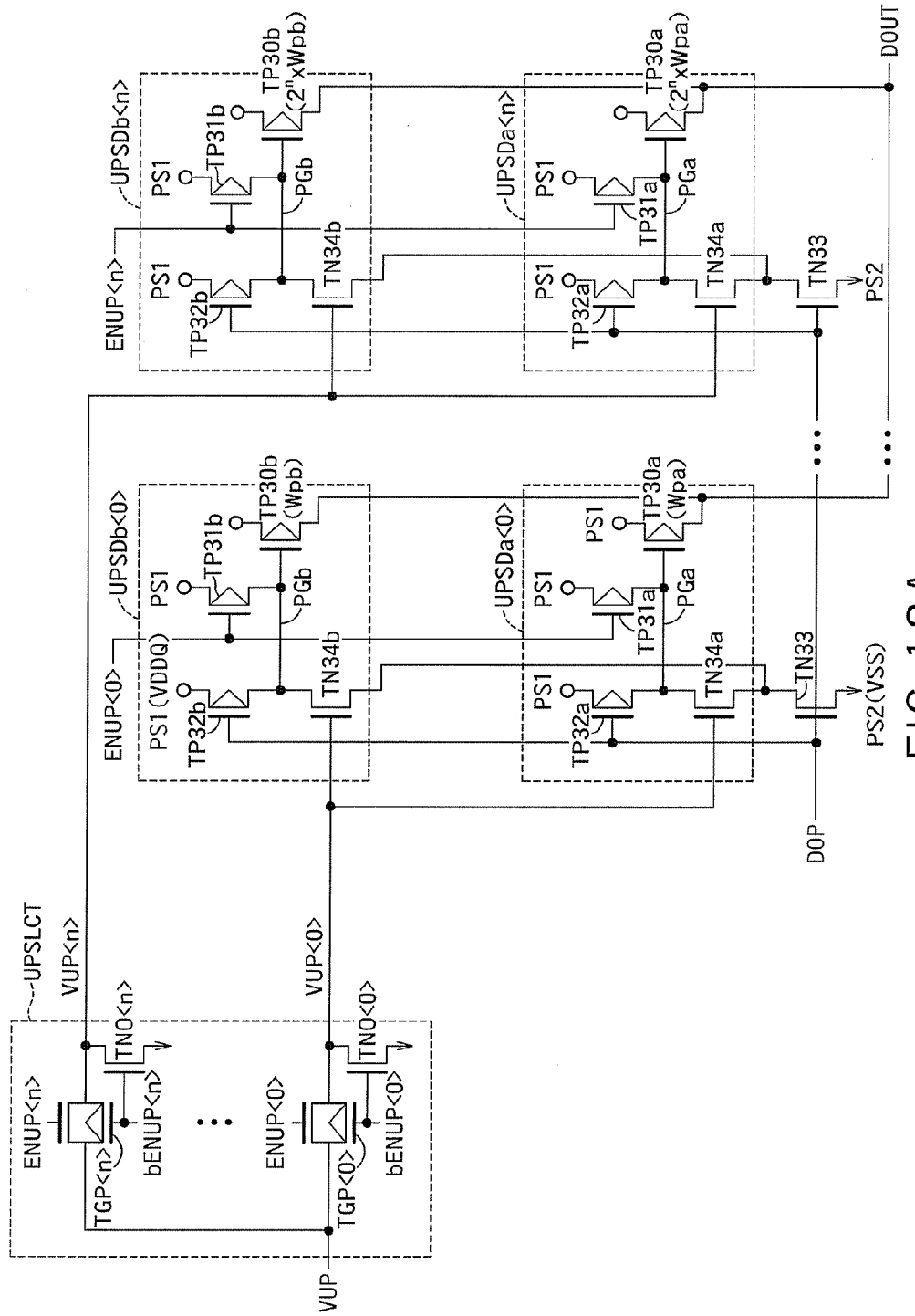
FIGS. 13A and 13B are circuit diagrams showing more detailed configurations of an output driver OD, a pull-up selector UPSLCT, and a pull-down selector DNSLCT according to a ninth embodiment.
Figure 13B:
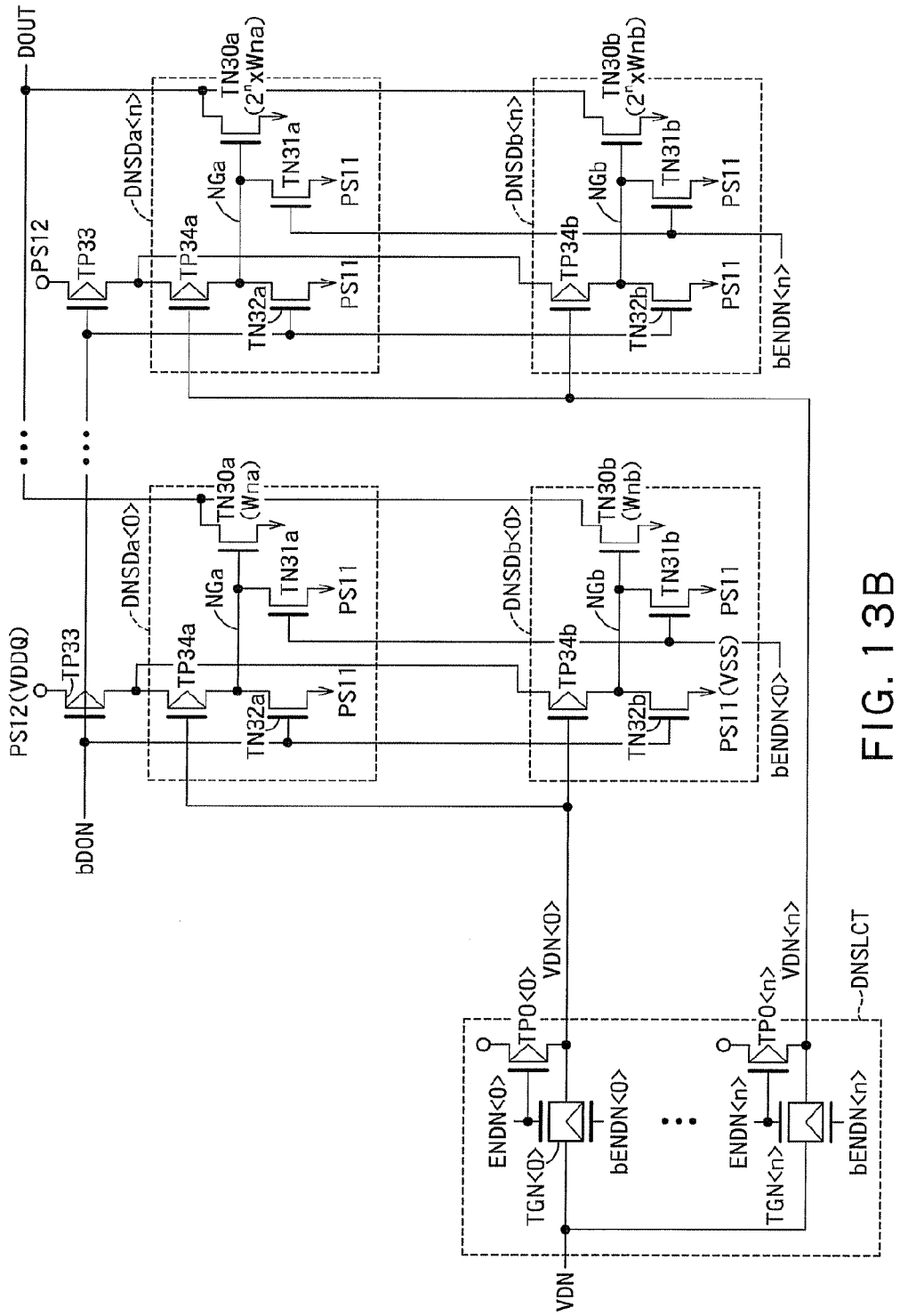

FIGS. 13A and 13B are circuit diagrams showing more detailed configurations of an output driver OD, a pull-up selector UPSLCT, and a pull-down selector DNSLCT according to a ninth embodiment. In the ninth embodiment, in a group of pull-up sub-drivers (UPSDa<i> and UPSDb<i>), switching transistors (TN33a and TN33b) are formed into a common switching transistor. In addition, in a group of pull-down sub-drivers (DNSDa<i> and DNSDb<i>), switching transistors (TP33a and TP33b) are formed into a common switching transistor. In this case, in order to make the discharge rates of gate nodes PGa and PGb of transistors TP30a and TP30b in FIG. 13A different from each other, there is a need to make the capacitance at the gate node PGa and the capacitance at the gate node PGb different from each other. Namely, the gate width of the transistor TP30a differs from the gate width of the transistor TP30b. Alternatively, the gate widths of transistors TN34a and TN34b may be made different from each other to make their current drive capabilities different from each other. In addition, in order to make the charge rates of gate nodes NGa and NGb of transistors TN30a and TN30b in FIG. 13B different from each other, there is a need to make the capacitance at the gate node NGa and the capacitance at the gate node NGb different from each other. Namely, the gate width of the transistor TN30a differs from the gate width of the transistor TN30b. Alternatively, the gate widths of transistors TP34a and TP34b may be made different from each other to make their current drive capabilities different from each other.

Other configurations in the ninth embodiment may be the same as the corresponding ones in the eighth embodiment. Since the ON timings of the transistors TP30a and TP30b or the transistors TN30a and TN30b differ from each other, the ninth embodiment can obtain the same effect as that obtained by the eighth embodiment. Furthermore, in the ninth embodiment, since in a group of pull-up sub-drivers (UPSDa<i> and UPSDb<i>) or a group of pull-down sub-drivers (DNSDa<i> and DNSDb<i>), a common switching transistor TN33 or TP33 is used, the layout area of an output driver OD is smaller than those in the seventh and eighth embodiments.

Tenth Embodiment

Figure 14A:
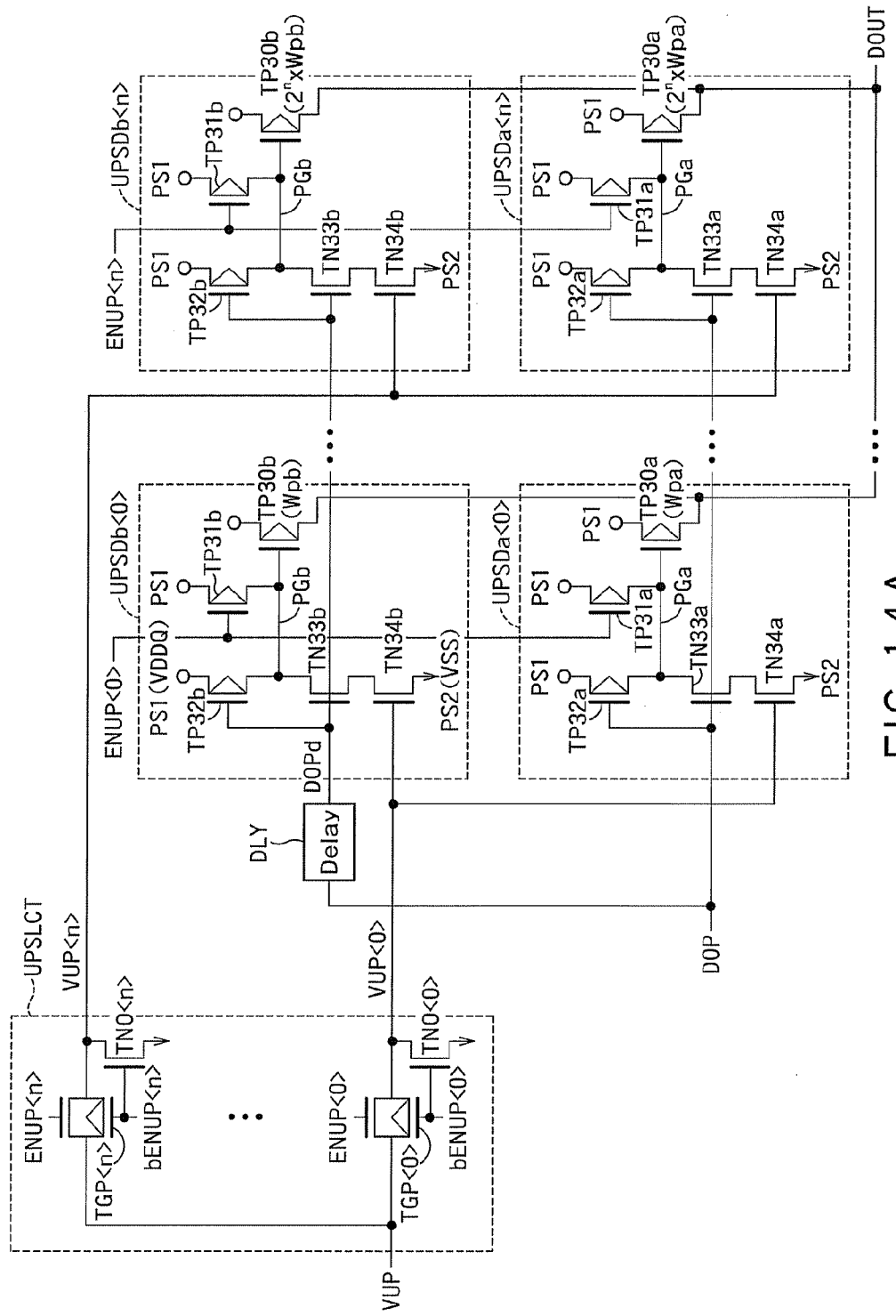
FIGS. 14A and 14B are circuit diagrams showing more detailed configurations of an output driver OD, a pull-up selector UPSLCT, and a pull-down selector DNSLCT according to a tenth embodiment.
Figure 14B:
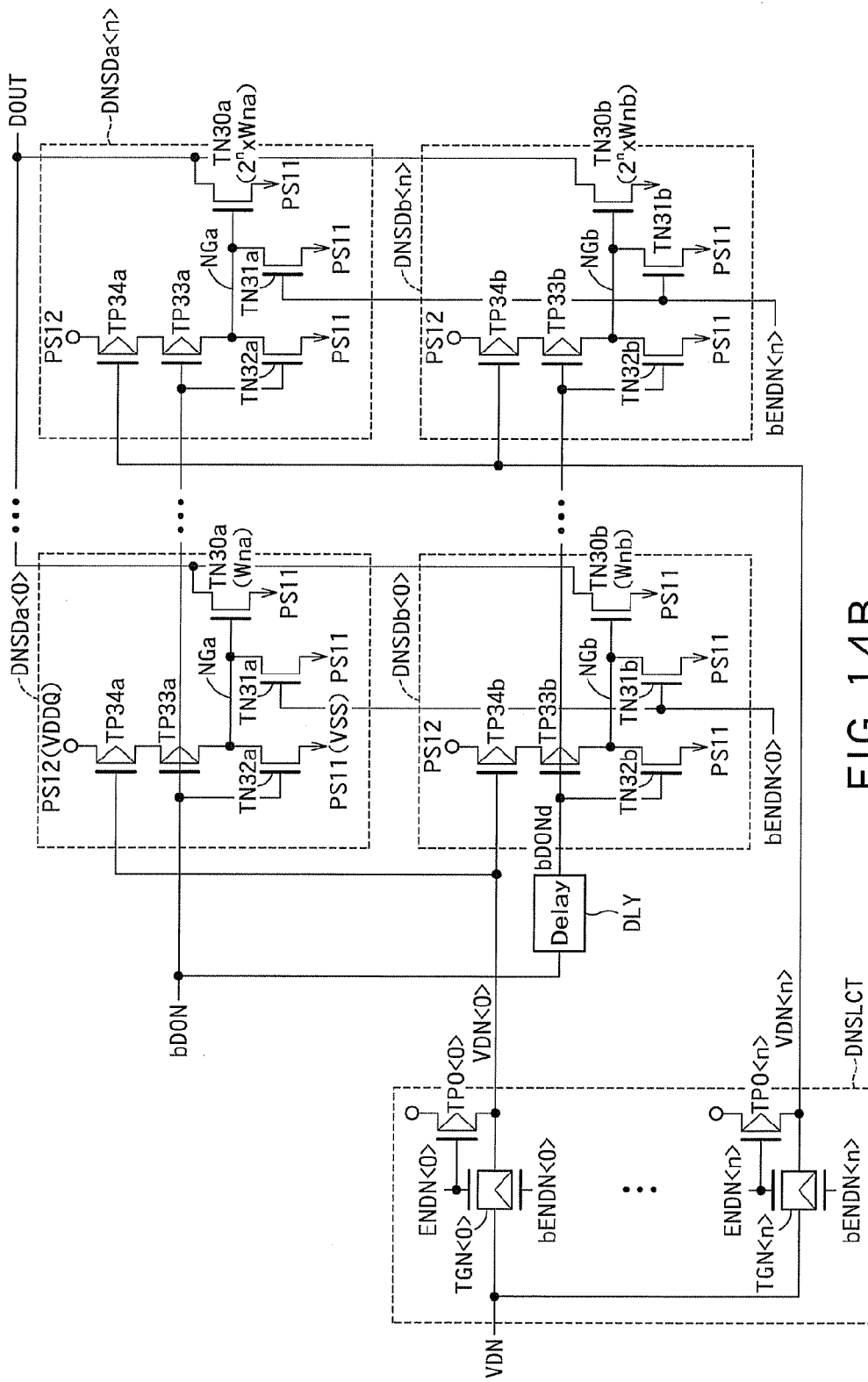

FIGS. 14A and 14B are circuit diagrams showing more detailed configurations of an output driver OD, a pull-up selector UPSLCT, and a pull-down selector DNSLCT according to a tenth embodiment. In the tenth embodiment, a delay circuit DLY is connected to the gate of a switching transistor TN33b in a sub-driver UPSDb<0> which is one of pull-up sub-drivers (UPSDa<0> and UPSDb<0>) forming a group. In addition, a delay circuit DLY is connected to the gate of a switching transistor TP33b in a sub-driver DNSDb<0> which is one of pull-down sub-drivers (DNSDa<0> and DNSDb<0>) forming a group. Other configurations in the tenth embodiment may be the same as the corresponding ones in the seventh embodiment.

Figure 15A:
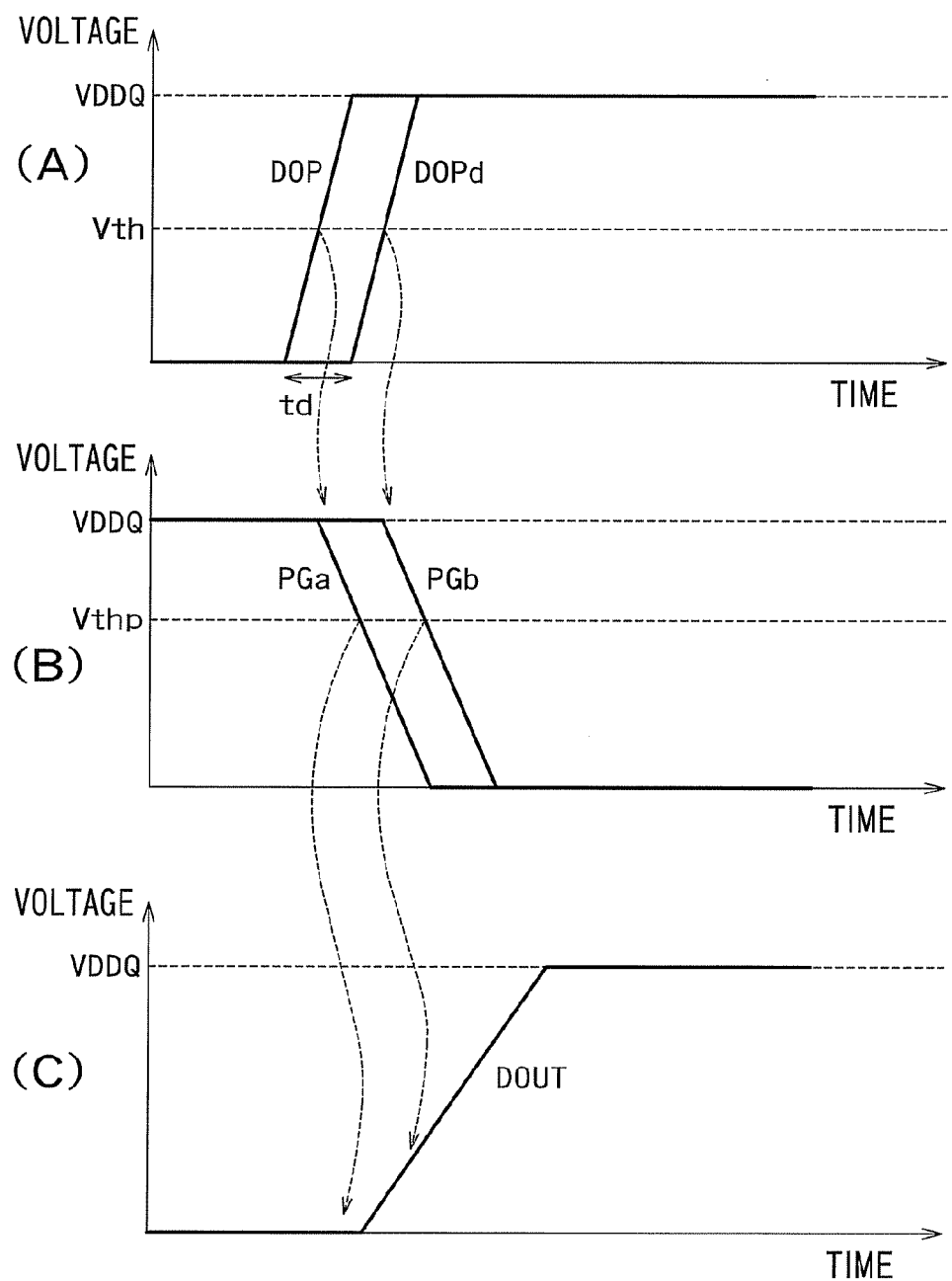
FIGS. 15A and 15B are timing diagrams showing the operations of an output driver OD of the tenth embodiment.
Figure 15B:
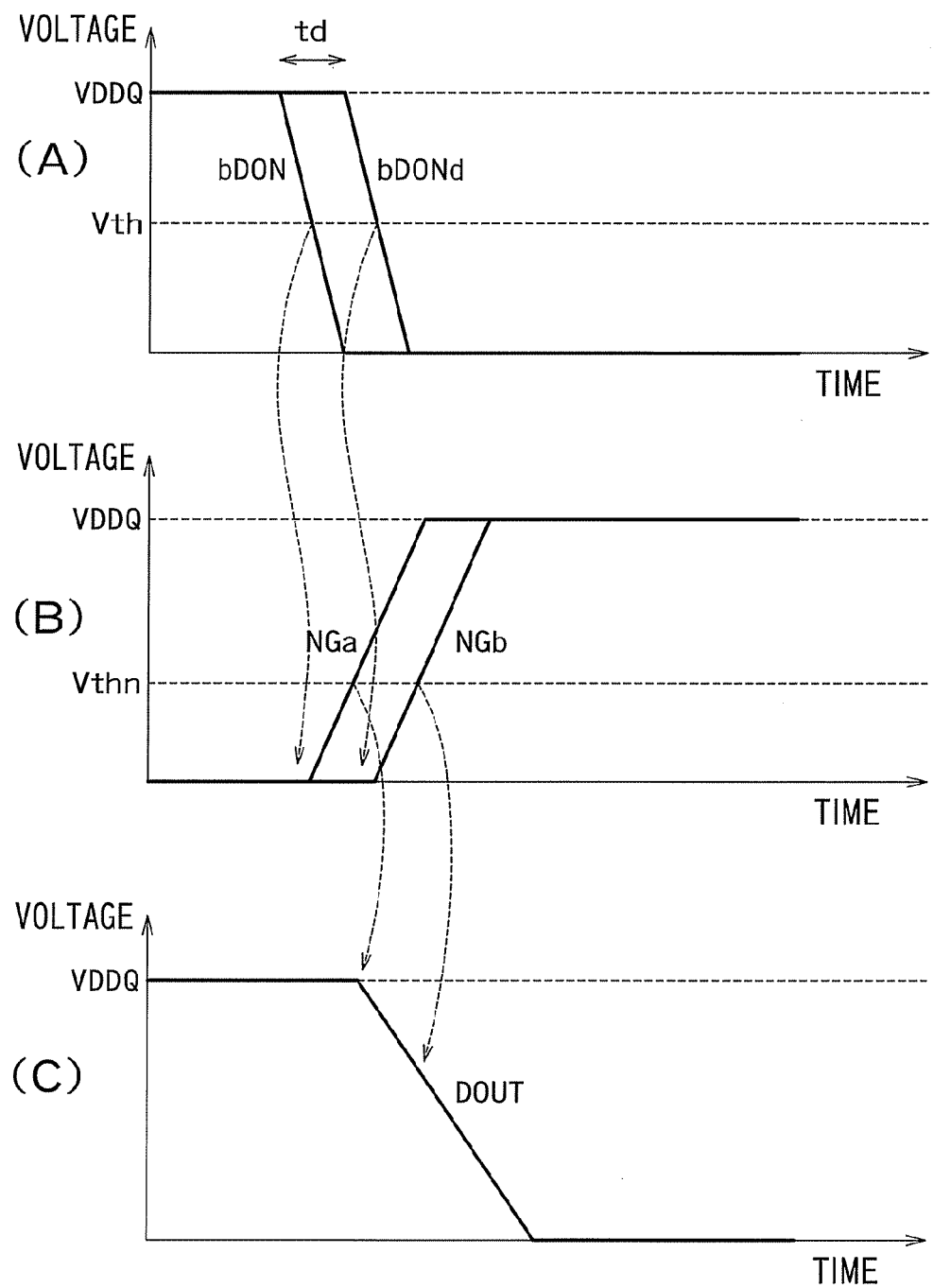

FIGS. 15A and 15B are timing diagrams showing the operations of an output driver OD of the tenth embodiment. In a pull-up sub-driver group (UPSDa<i> and UPSDb<i>), a signal DOPd inputted to the gate of a switching transistor TN33b is delayed by td from a signal DOP inputted to the gate of a switching transistor TN33a ((A) of FIG. 15A). Therefore, the voltage at a gate node PGb drops delayed from the voltage at a gate node PGa ((B) of FIG. 15A). As a result, the ON timings of an output transistors TP30a and TP30b are shifted from each other, enabling to suppress a current peak in a transition of output data from logic low to logic high ((C) of FIG. 15A).

In a pull-down sub-driver group (DNSDa<i> and DNSDb<i>), a signal bDONd inputted to the gate of a switching transistor TP33b is delayed by td from a signal bDON inputted to the gate of a switching transistor TP33a ((A) of FIG. 15B). Therefore, the voltage at a gate node NGb rises delayed from the voltage at a gate node NGa ((B) of FIG. 15B). As a result, the ON timing of an output transistors TN30a and TN30b are shifted from each other, enabling to suppress a current peak in a transition of output data from logic high to logic low ((C) of FIG. 15B).

In the tenth embodiment, the ratio of a gate width WN34a of a transistor TN34a to a gate width WN34b of a transistor TN34b in FIG. 14A (WN34a/WN34b), i.e., the current drive capabilities of the transistors TN34a and TN34b, is equal to the ratio of a capacitance CPGa at a gate node PGa to a capacitance CPGb at a gate node PGb (CPGa/CPGb). Furthermore, the ratio of a gate width WP34a of a transistor TP34a to a gate width WP34b of a transistor TP34b in FIG. 14B (WP34a/WP34b), i.e., the current drive capabilities of the transistors TP34a and TP34b, is equal to the ratio of a capacitance CNGa at a gate node NGa to a capacitance CNGb at a gate node NGb (CNGa/CNGb). By this, as shown in FIGS. 15A and 15B, the slopes of voltage drop at the gate nodes PGa and PGb are equal and the slopes of voltage rise at the gate nodes NGa and NGb are also equal.

As such, in the tenth embodiment, although the discharge rates of the gate node PGa of the output transistor TP30a and the gate node PGb of the output transistor TP30b are made equal, the ON timings of the transistors TP30a and TP30b are shifted from each other. In addition, although the charge rates of the gate node NGa of the output transistor TN30a and the gate node NGb of the output transistor TN30b are made equal, by shifting the ON timings of the transistors TN30a and TN30b from each other, a current peak in a transition of output data is suppressed, enabling to prevent ringing or reflection of an output signal. Accordingly, the tenth embodiment can obtain the same effect as that obtained by the seventh embodiment.

Eleventh Embodiment

In an eleventh embodiment, the above-described ratio WN34a/WN34b and ratio CPGa/CPGb are made different from each other and the ratio WP34a/WP34b and the ratio CNGa/CNGb are made different from each other. Other configurations in the eleventh embodiment may be the same as those in the tenth embodiment. Therefore, circuit configurations in the eleventh embodiment are the same as those shown in FIGS. 14A and 14B.

Figure 16A:
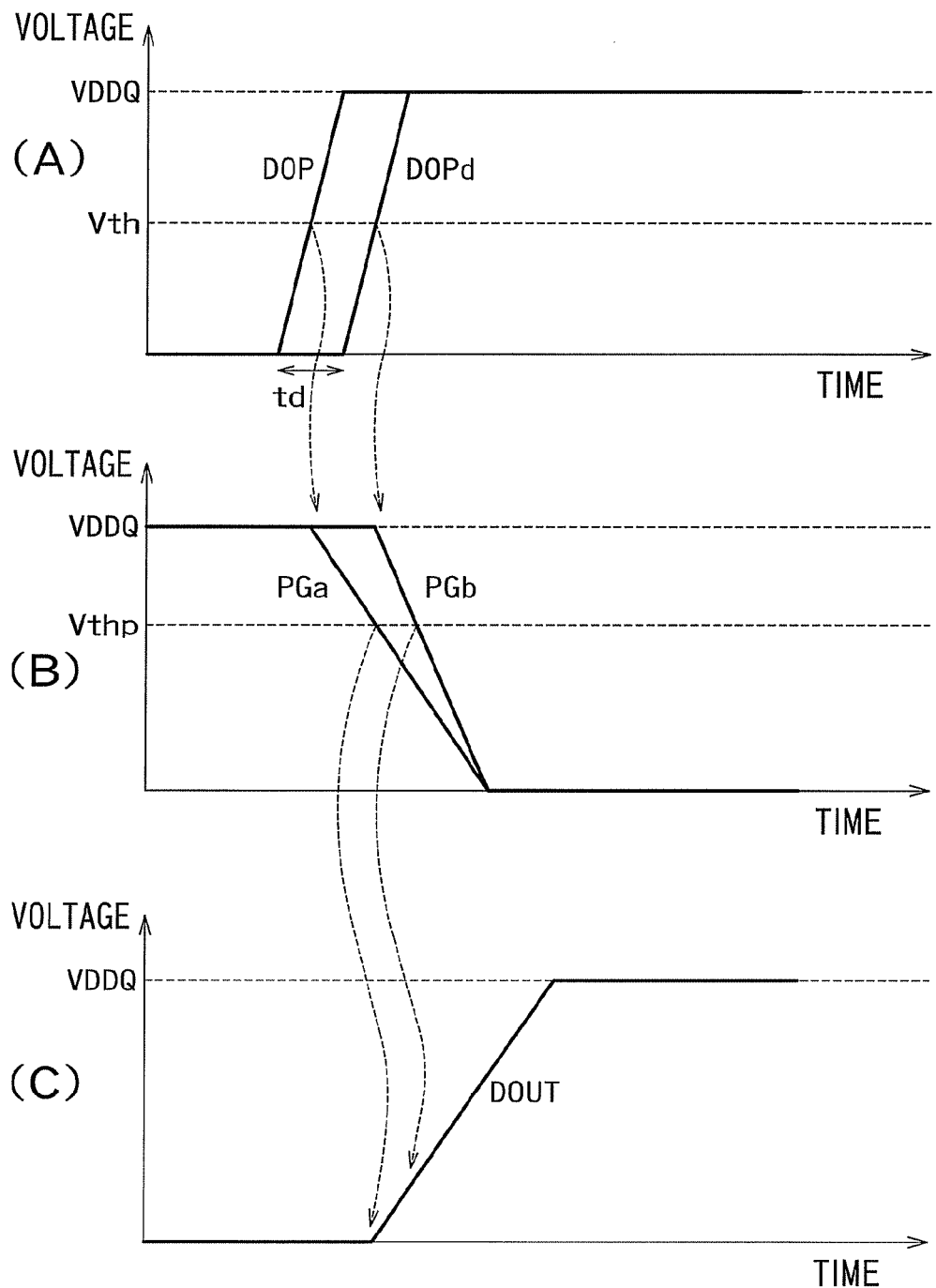
FIGS. 16A and 16B are timing diagrams showing the operations of an output driver OD of the eleventh embodiment.
Figure 16B:
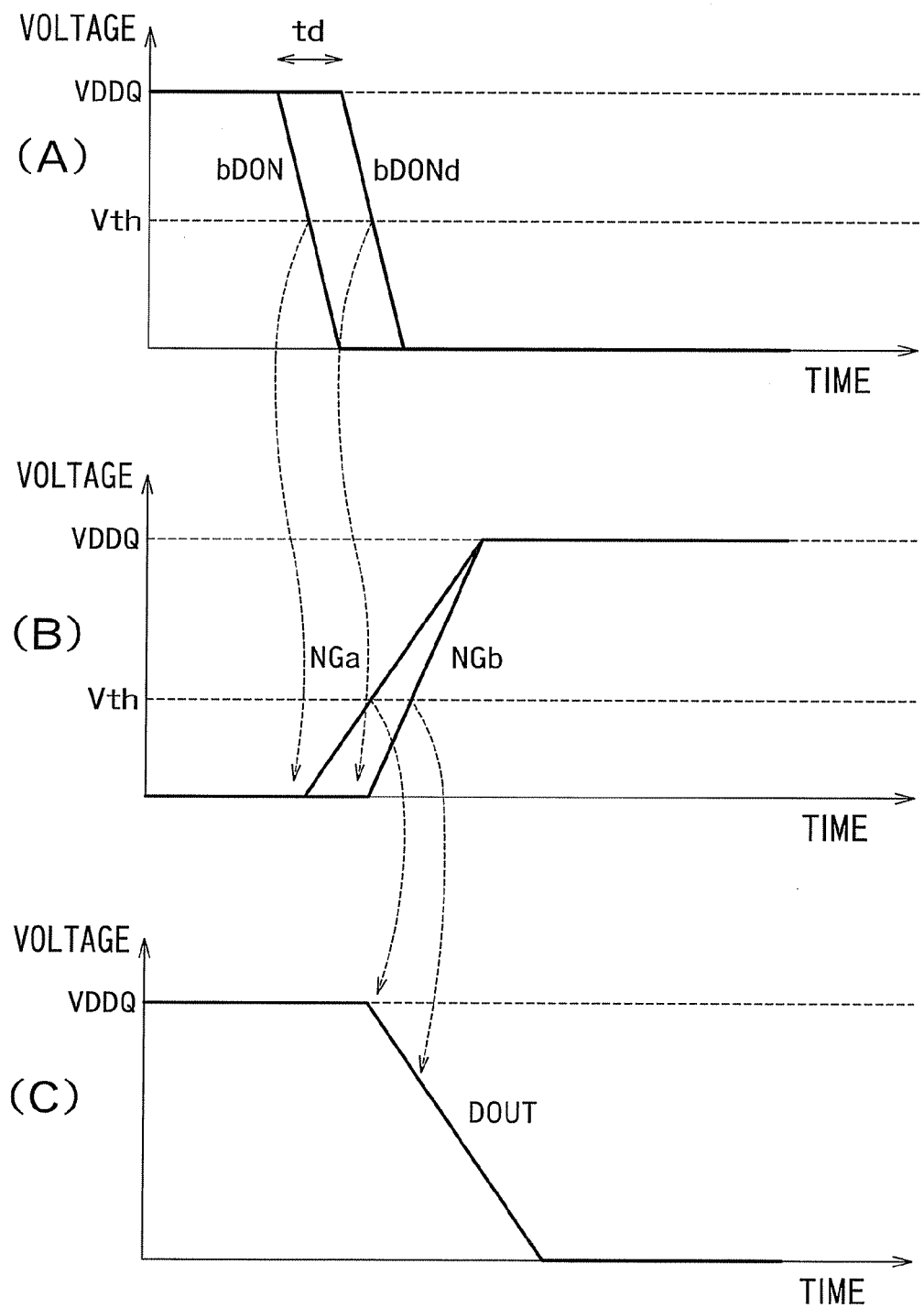

FIGS. 16A and 16B are timing diagrams showing the operations of an output driver OD of the eleventh embodiment. In pull-up sub-drivers UPSDa<i> and UPSDb<i>, a signal DOPd inputted to the gate of a switching transistor TN33b is delayed by td from a signal DOP inputted to the gate of a switching transistor TN33a ((A) of FIG. 16A). Therefore, the voltage at a gate node PGb starts to fall delayed from the voltage at a gate node PGa ((B) of FIG. 16A). Here, since the ratio WN34a/WN34b differs from the ratio CPGa/CPGb, the slope of voltage drop at the gate node PGb differs from the slope of voltage drop at the gate node PGa. Namely, the slew rate of an output with which a transistor TP30a is concerned differs from the slew rate of an output with which a transistor TP30b is concerned. Therefore, since the ON timings of the transistors TP30a and TP30b are shifted from each other and the slew rates of the outputs with which they are concerned also differ from each other, a current peak in the transition of output data from logic low to logic high can be suppressed ((C) of FIG. 16A).

In pull-down sub-drivers DNSDa<i> and DNSDb<i>, a signal bDONd inputted to the gate of a switching transistor TP33b is delayed by td from a signal bDON inputted to the gate of a switching transistor TP33a ((A) of FIG. 16B). Therefore, the voltage at a gate node NGb starts to rise delayed from the voltage at a gate node NGa ((B) of FIG. 16B). Here, since the ratio WP34a/WP34b differs from the ratio CNGa/CNGb, the slope of voltage rise at the gate node NGb differs from the slope of voltage rise at the gate node NGa. Namely, the slew rate of an output with which a transistor TN30a is concerned differs from the slew rate of an output with which a transistor TN30b is concerned. Therefore, since the ON timings of the transistors TN30a and transistor TN30b are shifted from each other and the slew rates of the outputs with which they are concerned also differ from each other, a current peak in the transition of output data from logic high to logic low can be suppressed ((C) of FIG. 16B).

Delay circuits DLYs of the eleventh embodiment can also be applied to the seventh to ninth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a core circuit comprising an integrated circuit;
a plurality of output drivers, each comprising a plurality of sub-drivers in order to output digital data transferred from the core circuit, as output data; and
a selector configured to select a sub-driver to be driven from among the plurality of sub-drivers, wherein
each of the sub-drivers comprises:
an output transistor connected between a first power supply and an output wiring line in order to allow the output data to rise or fall according to the digital data; and
a switching transistor and a slew-rate control transistor which are connected in series between a gate of the output transistor and a second power supply,
the switching transistor turns on or off the output transistor according to the digital data, and
the slew-rate control transistors in the plurality of sub-drivers are individually controllable, respectively, by signals from the selector.

2. The device according to claim 1, wherein the selector has a transfer gate that transfers, based on an enable signal for determining a selected sub-driver to be driven among the plurality of sub-drivers, a slew-rate control signal for determining a conducting state of the slew-rate control transistor in the selected sub-driver.

3. The device according to claim 2, wherein transfer gates are provided in a same number as that of the sub-drivers.

4. The device according to claim 1, wherein
the plurality of sub-drivers include: a plurality of pull-up sub-drivers, each including a first output transistor connected between the first power supply and the output wiring line in order to output logic high of the digital data; and a plurality of pull-down sub-drivers, each including a second output transistor connected between the second power supply and the output wiring line in order to output logic low of the digital data, the second power supply having a lower potential than the first power supply,
gates of switching transistors in the plurality of pull-up sub-drivers receive a signal according to the digital data in common, and
gates of switching transistors in the plurality of pull-down sub-drivers also receive a signal according to the digital data in common.

5. The device according to claim 2, wherein
the plurality of sub-drivers include: a plurality of pull-up sub-drivers, each including a first output transistor connected between the first power supply and the output wiring line in order to output logic high of the digital data; and a plurality of pull-down sub-drivers, each including a second output transistor connected between the second power supply and the output wiring line in order to output logic low of the digital data, the second power supply having a lower potential than the first power supply, gates of switching transistors in the plurality of pull-up sub-drivers receive a signal according to the digital data in common, and gates of switching transistors in the plurality of pull-down sub-drivers also receive a signal according to the digital data in common.

6. The device according to claim 2, further comprising a slew rate controller that sets a voltage of the slew-rate control signal in order to control a conducting state of the slew-rate control transistor.

7. The device according to claim 3, further comprising a slew rate controller that sets a voltage of the slew-rate control signal in order to control a conducting state of the slew-rate control transistor.

8. The device according to claim 4, further comprising a slew rate controller that sets a voltage of the slew-rate control signal in order to control a conducting state of the slew-rate control transistor.

9. The device according to claim 1, wherein
the output drivers are provided for respective output pads that output data outside the device, and
the selector is shared by the plurality of output drivers.

10. The device according to claim 1, wherein the output drivers and the selector are provided for respective output pads that output data outside the device.

11. The device according to claim 9, wherein the slew rate controller is provided for the selector.

12. The device according to claim 10, wherein the slew rate controller is provided for the selector.

13. The device according to claim 10, wherein the slew rate controller is shared by a plurality of the selectors.

14. The device according to claim 1, wherein
the output drivers are provided for respective output pads that output data outside the device, and
the selector is shared by the plurality of output drivers adjacent to each other.

15. A semiconductor device comprising:
a core circuit comprising an integrated circuit
a plurality of output drivers, each comprising a plurality of sub-drivers in order to output digital data transferred from the core circuit, as output data and
a selector configured to select a sub-driver to be driven from among the plurality of sub-drivers, wherein
each of the sub-drivers comprises:
an output transistor connected between a first power supply and an output wiring line in order to allow the output data to rise or fall according to the digital data; and
a switching transistor and a first slew-rate control transistor which are connected in series between a gate of the output transistor and a second power supply,
a second slew-rate control transistor connected in parallel with the first slew-rate control transistor,
the switching transistor turns on or off the output transistor according to the digital data, and
the first and second slew-rate control transistors in the plurality of sub-drivers are individually controllable, respectively, by signals from the selector.

16. The device according to claim 1, wherein the core circuit comprises at least a memory circuit.

17. The device according to claim 15, wherein the core circuit comprises at least a memory circuit.

18. A semiconductor device comprising:
a core circuit comprising an integrated circuit;
a plurality of output drivers, each comprising a plurality of sub-drivers in order to output digital data transferred from the core circuit, as output data; and
a selector configured to select a sub-driver to be driven from among the plurality of sub-drivers, wherein
each of the sub-drivers comprises:
an output transistor connected between a first power supply and an output wiring line in order to allow the output data to rise or fall according to the digital data; and
a switching transistor and a slew-rate control transistor which are connected in series between a gate of the output transistor and a second power supply,
the switching transistor turns on or off the output transistor according to the digital data, and
the slew-rate control transistors in the plurality of sub-drivers have both a first function to determine a slew rate for rise or fall of the output data and a second function to selectively drive at least a sub-driver from among the sub-drivers.

19. The device according to claim 18, wherein the core circuit comprises at least a memory circuit.

* * * * *